(12) United States Patent
Takeuchi et al.

(10) Patent No.: US 9,000,418 B2
(45) Date of Patent: Apr. 7, 2015

(54) FIELD EFFECT TRANSISTOR, METHOD OF MANUFACTURING THE SAME, AND ELECTRONIC DEVICE USING THE SAME

(75) Inventors: Takayuki Takeuchi, Osaka (JP); Kenji Harada, Osaka (JP); Nobuaki Kambe, Hyogo (JP); Jun Terao, Osaka (JP)

(73) Assignee: Panasonic Corporation, Osaka (JP)

( * ) Notice: Subject to any disclaimer, the term of this patent is extended or adjusted under 35 U.S.C. 154(b) by 2197 days.

(21) Appl. No.: 11/719,641

(22) PCT Filed: Nov. 18, 2005

(86) PCT No.: PCT/JP2005/021270
§ 371 (c)(1),
(2), (4) Date: May 17, 2007

(87) PCT Pub. No.: WO2006/054709
PCT Pub. Date: May 26, 2006

(65) Prior Publication Data
US 2009/0152532 A1 Jun. 18, 2009

(30) Foreign Application Priority Data
Nov. 19, 2004 (JP) ................................ 2004-335726

(51) Int. Cl.
| | | |
|---|---|---|
| *H01L 51/00* | (2006.01) | |
| *H01L 51/40* | (2006.01) | |
| *H01L 51/05* | (2006.01) | |

(52) U.S. Cl.
CPC ........ *H01L 51/0068* (2013.01); *H01L 51/0052* (2013.01); *H01L 51/0541* (2013.01); *H01L 51/0545* (2013.01); *H01L 51/0566* (2013.01)

(58) Field of Classification Search
USPC ............... 257/40, E51.001, E21.532; 438/99
See application file for complete search history.

(56) References Cited

U.S. PATENT DOCUMENTS

| | | |
|---|---|---|
| 2004/0238814 A1 | 12/2004 | Mizusaki et al. |
| 2005/0056828 A1 | 3/2005 | Wada et al. |

FOREIGN PATENT DOCUMENTS

| | | |
|---|---|---|
| JP | 2003-298067 | 10/2003 |
| JP | 2004-88090 | 3/2004 |
| JP | 2004-273881 | 9/2004 |

OTHER PUBLICATIONS

Holm, C; Rehahn, M; Oppermann, W; Ballauff, M. "Stiff-chain polyelectrolytes." Advances in Polymer Science (2004) 166 (Polyelectrolytes with Defined Molecular Architecture II), 1-27. CODEN: APSIDK; ISSN: 0065-3195.*
Peter N. Taylor et al., "Insulated Molecular Wires: Synthesis of Conjugated Polyrotaxanes by Suzuki Coupling in Water", Angewandte Chemie, International Edition, 39, No. 19, pp. 3456-3460, 2000.

* cited by examiner

*Primary Examiner* — Lynne Gurley
*Assistant Examiner* — Naima Kearney
(74) *Attorney, Agent, or Firm* — Hamre, Schumann, Mueller & Larson, P.C.

(57) ABSTRACT

A field-effect transistor includes a semiconductor layer (14) having a portion functioning as a channel region. The semiconductor layer (14) includes, as its constituent components, a plurality of electrically conductive microparticles (52), organic semiconductor molecules (53) bonded to the microparticles (52) so as to link the microparticles to one another (52), and cyclic molecules. Each of the organic semiconductor molecules (53) includes a $\pi$-electron conjugated chain as its main chain, and the $\pi$-electron conjugated chain is insulated by cyclic molecules.

8 Claims, 20 Drawing Sheets

FIELD EFFECT TRANSISTOR, METHOD OF MANUFACTURING THE SAME, AND ELECTRONIC DEVICE USING THE SAME

TECHNICAL FIELD

The present invention relates to a field-effect transistor having a semiconductor layer containing organic molecules, a method of manufacturing the field-effect transistor, and an electronic device using the transistor.

BACKGROUND ART

Organic materials include a wide variety of carbon skeleton-based compounds. Among them, electrically conductive organic molecules particularly have been confirmed to exhibit versatile electrical properties that originate from their molecular structures. Various proposals have been made to use them for a variety of organic electronic device applications, such as thin film transistors, sensors, organic LEDs, capacitors, batteries, biofunctional devices, and lasers.

Thin film transistors (hereinafter also referred to as "TFTs") are currently expected to be useful drive elements for such devices as active matrix liquid crystal displays. TFTs normally are formed of inorganic semiconductor materials, such as amorphous silicon and low-temperature polysilicon. Cost reductions and larger panel areas are possible by using organic molecules to form the semiconductor layer of a TFT.

Nevertheless, organic semiconductors that have been reported to date show lower carrier mobilities than those of inorganic semiconductors, and the device elements that use the organic semiconductors have problems such as high driving voltage. For this reason, much research effort has been directed to improvements in the carrier mobility of organic semiconductors and to reductions in driving voltage of device elements that use organic semiconductors.

Most field-effect transistors (hereinafter also referred to as the "FET") that use organic semiconductor molecules fail to achieve desired device characteristics that are expected from inherent properties of the organic semiconductor molecules. One of the causes is as follows. Although the charge transfer within an organic semiconductor molecule is very fast, the charge transfer from one organic semiconductor molecule to another is slower than that. Consequently, the latter charge transfer speed restricts the overall performance of the semiconductor layer. As one of the means to improve this drawback, a semiconductor layer in which a conduction path is formed by fine particles made of a conductor or a semiconductor and organic semiconductor molecules bonded thereto has been disclosed (JP 2004-88090A).

On the other hand, an electronic device that uses a n-conjugated polymer as the electrically conductive organic molecules tends to be adversely affected by oxygen and water easily, and this requires an additional complication in that a sealing structure or the like needs to be provided in order to maintain the device characteristics. As one method for improving this drawback, a method for improving device reliability by enclosing a conductive polymer with an insulative cyclic molecule such as cyclodextrin has been disclosed (JP 2003-298067A).

According to the means described in JP 2004-88090A, either a conductor or a semiconductor may be selected as the microparticles. In terms of device design, it is preferable to use microparticles made of a conductor because simple device characteristics are obtained more easily when the semiconductor properties are exhibited using only an organic material. However, if the chain length of the organic semiconductor molecule is short relative to the particle size of the microparticles, the use of a conductor for the microparticles can result in the conductive microparticles contacting each other or hopping of charge carriers between the microparticles. As a consequence, the problems of short circuits and leakage current increases may arise. If the chain length of the organic semiconductor molecule is made longer in order to resolve the foregoing problems, another problem arises in that the linearity of the molecule becomes poor, which leads to entanglement of the organic semiconductor molecules with one another and bonding of opposing ends of the molecule to the same microparticle, and desired characteristics cannot be obtained.

DISCLOSURE OF THE INVENTION

In view of these circumstances, it is an object of the present invention to provide a field-effect transistor having a semiconductor layer that contains organic molecules and achieves high carrier mobility, a manufacturing method of the field-effect transistor, and various types of electronic devices using the field-effect transistor.

In order to accomplish the foregoing object, the present invention provides a field-effect transistor including: a semiconductor layer having a portion functioning as a channel region, the semiconductor layer containing, as its constituent components, a plurality of electrically conductive microparticles dispersed in the semiconductor layer, organic semiconductor molecules chemically bonded to the microparticles so as to link the microparticles to one another, and cyclic molecules, each of the organic semiconductor molecules having a π-electron conjugated chain as its main chain, and the π-electron conjugated chain being insulated by the cyclic molecules.

In addition, an electronic device according to the present invention is an electronic device including at least one field-effect transistor, the field-effect transistor including a semiconductor layer having a portion functioning as a channel region, the semiconductor layer containing, as its constituent components, a plurality of electrically conductive microparticles dispersed in the semiconductor layer, organic semiconductor molecules chemically bonded to the microparticles so as to link the microparticles to one another, and cyclic molecules, each of the organic semiconductor molecules having a π-electron conjugated chain as its main chain, and the π-electron conjugated chain being insulated by the cyclic molecules.

The present invention also provides a method of manufacturing a field-effect transistor including a semiconductor layer containing a plurality of electrically conductive microparticles, the method including: (I) contacting the plurality of the microparticles with organic semiconductor molecules in a solvent, the organic semiconductor molecules each having a π-electron conjugated chain insulated by cyclic molecules and two end groups that are disposed at opposing ends of the π-electron conjugated chain and are chemically bonded to the microparticles, to chemically bond the microparticles and the end groups of the organic semiconductor molecules; and (II) removing the solvent. It should be noted that in this specification, the term "solvent" is meant to include a dispersion medium.

In the field-effect transistor of the present invention, the conductive microparticles are linked to one another by π-electron conjugated chains. Since the π-electron conjugated chain is insulated by a ring compound, the relatively high linearity of the chain is ensured even when the main chain length is long. Accordingly, the present invention makes available a field-effect transistor that exhibits less shorting, less leakage current, higher carrier mobility, and better stability. Moreover, the present invention can improve the resistance to oxygen and water, which has been a problem with the semiconductor layer using organic semiconductor molecules.

Furthermore, since the electronic device according to the present invention uses the field-effect transistor according to the present invention, the transistors can be formed at a low temperature on a flexible substrate, such as a plastic substrate. Therefore, the present invention enables the electronic device to have such characteristics as being flexible and light in weight.

BRIEF DESCRIPTION OF THE DRAWINGS

[FIG. 1]

[FIG. 2]

[FIG. 3]

[FIG. 4]

FIG. 5 is a schematic view illustrating the state of the semiconductor layer in the vicinity of the source electrode of a FET according to the present invention.

FIG. 6 is a schematic view illustrating the state of the semiconductor layer in the vicinity of the source electrode of another example of the FET according to the present invention.

[FIG. 7]

FIG. 8 illustrates an example of a end group of the organic semiconductor molecule used in the present invention.

FIG. 9 is a partially exploded perspective view schematically illustrating one example of the active matrix display according to the present invention.

FIG. 10 is a perspective view schematically illustrating the configuration of a drive circuit of the display shown in FIG. 9 and its periphery.

FIG. 11 is a perspective view schematically illustrating the configuration of one example of a wireless ID tag.

FIG. 12 is a perspective view schematically illustrating the configuration of one example of a portable television.

FIG. 13 is a perspective view schematically illustrating the configuration of one example of a telecommunication terminal.

FIG. 14 is a perspective view schematically illustrating the configuration of one example of a portable medical device.

[FIG. 15]

FIG. 16 illustrates one example of the synthesizing process of the compound shown in FIG. 4B.

FIG. 17 illustrates process steps subsequent to the process steps shown in FIG. 16.

FIG. 18 illustrates one example of the synthesizing process of the compound shown in FIG. 7A.

FIG. 19 illustrates one example of the synthesizing process of the compound shown in FIG. 7B.

BEST MODE FOR CARRYING OUT THE INVENTION

Figure 1A:
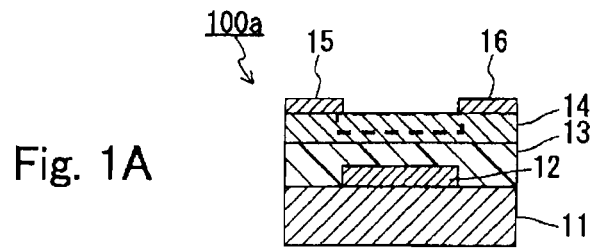
FIGS. 1A to 1D are cross-sectional views schematically illustrating an example of the FET according to the present invention.

Hereinbelow, embodiments of the present invention are described.
[Field-Effect Transistor]

The field-effect transistor according to the present invention is furnished with a semiconductor layer having a portion functioning as a channel region. The semiconductor layer contains, as its constituent components, a plurality of electrically conductive microparticles dispersed in the semiconductor layer organic semiconductor molecules (hereinafter also referred to as "organic molecules (A)") chemically bonded to the microparticles to link the microparticles to one another, and cyclic molecules. Each of the organic molecules (A) includes a π-electron conjugated chain as its main chain. The π-electron conjugated chain is insulated by the cyclic molecules. In the semiconductor layer, the microparticles and the organic molecules (A) form a mesh-like network. The constituent parts other than the semiconductor layer are not particularly limited, and known configurations and materials may be employed therefor.

The just-mentioned semiconductor layer is a layer whose conductivity varies according to the applied electric field. The thickness of the semiconductor layer is not particularly limited, and may be within the range of from 30 nm to 1 ρm, for example. The semiconductor layer typically contains electrically conductive microparticles, organic semiconductor molecules, and cyclic molecules, but it may contain other substances as long as the advantageous effects of the present invention can be obtained. However, the total amount of the electrically conductive microparticles, the organic semiconductor molecules, and the cyclic molecules is normally 50 weight % or more of the semiconductor layer, for example, 90 weight % or more.

Each of the organic molecules (A) has, as its main chain, a molecular chain (π-electron conjugated chain) formed by n-conjugated bond, and it exhibits semiconductor properties. The opposing ends of the organic molecule (A) are bonded to the electrically conductive microparticles. It should be noted that a portion of the organic molecules (A) may be bonded to a source electrode or a drain electrode at their one ends. It is preferable that the main chain of the organic molecule (A) (π-electron conjugated chain) have high linearity. The main chain of the organic molecule (A) is not particularly limited as long as it is a π-electron conjugated chain that can be insulated by a ring compound, and for example, it has a structure in which one or a plurality of types of structures such as an aromatic ring, a polycyclic condensed aromatic, and a —CH=CH— group are linked. The organic molecules (A) may be one type of organic molecules or a plurality of types of organic molecules. Specific examples of the organic molecules (A) will be described later in Embodiment 1.

The main chain length of the organic molecule (A), in other words, the length of the π-electron conjugated chain that constitutes the main chain, may be within the range of from 5 nm to 50 nm, preferably within the range of from 10 nm to 30 nm. When the main chain length of the organic molecule (A) is controlled within the range of from 10 nm to 30 nm, good linearity of the main chain can be maintained, and the charge transfer utilizing the π-electron conjugated bond within the main chain can be utilized fully.

Herein, the main chain length of the organic molecule (A) refers to the distance of the linear line between the opposing ends of the main chain that is calculated from the molecular structure with which the linearity of the π-electron conjugated chain constituting the main chain is assumed to be the highest.

It is preferable that the average main chain length of the organic molecules (A) be equal to or greater than the average particle size of the foregoing microparticles. With this configuration, the distance between the microparticles is substantially equal to or greater than the average particle size of the microparticles. Therefore, shorting and leakage current can be prevented from increasing, and a highly reliable field-effect transistor can be obtained. It is more preferable that the average main chain length of the organic molecules (A) be within the range of from 1 to 3 times the average particle size of the microparticles.

The way in which the "average particle size" of the microparticles is determined will be described later. It also should be noted that in this specification, the term "average main chain length" of the organic molecules (A) means the main chain length of the organic molecule (A) with the highest content among a plurality of types of organic molecules (A) having different chain lengths. The main chain of an organic molecule (A) is normally formed by repetition of a predetermined constitutional unit. The numbers of the units are distributed around one value. Therein, the length of the main chain with the number of the repetitive units that accounts for the highest proportion is defined as the "average main chain length."

The organic molecules (A) may contain a plurality of types of molecules having different main chain lengths. With this configuration, the number of the organic semiconductor molecules that link the microparticles to one another is greater than in the case of using the organic semiconductor molecules with a uniform main chain length, making it possible to increase the amount of the electric current that is allowed to pass through the semiconductor layer.

The cyclic molecules may be any types of cyclic molecules as long as they can insulate the main chain of the organic molecule (A) and enhance the linearity of the main chain. Examples of the cyclic molecules include cyclodextrin, cyclodextrin derivatives, and a substance obtained by cross-linking cyclodextrin or derivatives thereof to form a tubular shape. Cyclodextrin is preferable since it has a short tubular shape. Specific examples of the cyclic molecules will be described also in Embodiment 1.

The organic molecule (A) insulated by cyclic molecules can be synthesized with known methods. Anderson et al. discloses one example of the synthesizing method that uses Suzuki coupling (Harry L. Anderson et al., "Insulated Molecular Wires," Angewandte Chemie International Edition, 2000, Vol. 39, No. 19, pp. 3456-3460.).

The electrically conductive microparticle, at least at its surface, is made of an electrically conductive material (conductor). For example, it may be formed of a metal, an electrically conductive metal oxide, or crystal of an electrically conductive organic substance. The electrically conductive microparticles may be formed of a plurality of materials. The shape of the microparticle is not particularly limited, and it may have a spherical shape, a rod-like shape, or a flake-like shape. A preferable example of the electrically conductive microparticles is gold microparticles. When the gold microparticles and the organic molecules (A) having mercapto groups at their ends are used, the organic molecules (A) tend to be bonded to the gold microparticles easily.

It is preferable that the average particle size of the electrically conductive microparticles be within the range of from 10 nm to 100 nm, and more preferably within the range of from 10 nm to 30 nm. The microparticles with an average particle size of less than 10 nm are neither easy to fabricate nor easy to disperse in the semiconductor layer uniformly. In addition, it is preferable from the viewpoint of fabrication that the main chain length of the organic molecule (A) be about several ten nanometers or less. For this reason, when using the microparticles with an average particle size of greater than 100 nm, it may become difficult to disperse the microparticles at a sufficient distance from one another, and shorting and an increase in leakage current tend to occur. By controlling the average particle size of the microparticles within the range of from 10 nm to 100 nm, a field-effect transistor with stable electrical characteristics and high reliability can be obtained.

An atomic group having a width that is greater than the inner diameter of the cyclic molecule that insulates the organic molecule (A) may be bonded to an end of the π-electron conjugated chain of the organic molecule (A). This configuration can prevent the cyclic molecule from being detached from the organic molecule (A). An example of the atomic group includes porphyrin.

The field-effect transistor of the present invention further may include at least one electrode in contact with the semiconductor layer (a source electrode and a drain electrode), and the surface of the electrode and the surface of the microparticles may have the same metallic element as their main component (content: 50 weight % or greater). In addition, a portion of the organic molecules (A) may be chemically bonded both to the surface of the electrode and to the microparticles. By forming the surface of the electrode and the surface of the microparticles from the same metallic element, each of the organic molecules (A) can be chemically bonded to the surface of the electrode and the surface of the microparticles through a predetermined end group. This configuration makes available a field-effect transistor with a low connection resistance between the semiconductor layer and the source/drain electrode. For example, gold microparticles may be used as the electrically conductive microparticles, a gold film used as the source/drain electrode, and organic molecules each having a mercapto group at opposing ends used as the organic molecules (A). In this case, each of the organic molecules (A) links two microparticles to each other, or links a microparticle to an electrode.

In the field-effect transistor of the present invention, the distance between the source and drain electrodes is normally 50 times or greater (for example, in the range of from 100 times to 10000 times) the average main chain length of the organic molecules (A). This configuration makes it possible to manufacture a field-effect transistor with a high mobility easily even when the source-drain distance is set at a distance feasible with common techniques such as a lithography technique and a printing technique (from submicrons to several ten microns).

[Electronic Device]

An electronic device according to the present invention contains at least one field-effect transistor. The field-effect transistor is the above-described field-effect transistor according to the present invention. The field-effect transistor according to the present invention has already been discussed above and therefore need not be elaborated on further.

The electronic device of the present invention may be an active matrix-type display, and it may use the field-effect transistor element as a switching element. The switching element performs driving of a pixel. This configuration makes available a high-performance sheet-like, or paper-like display at low cost.

The electronic device of the present invention may be a wireless ID tag. The field-effect transistor according to the present invention is utilized, for example, as a part of the semiconductor elements that constitute an integrated circuit of the wireless ID tag. This configuration makes it possible to obtain a wireless ID tag that can adhere onto objects or materials with various shapes. This configuration also makes available a wireless ID tag that can be formed into a desired shape.

The electronic device of the present invention may be a mobile device. The field-effect transistor according to the present invention is utilized, for example, as a part of the semiconductor elements that constitute an integrated circuit of the mobile device. This configuration enables the mobile device such as a portable television, a telecommunication terminal, a PDA, and a portable medical device to have additional advantages such as low cost, flexibility, shock resistance, and formability into desired shapes.

[Manufacturing Method of Field-Effect Transistor]

The manufacturing method of the field-effect transistor according to the present invention is a method of manufacturing a field-effect transistor having a semiconductor layer containing a plurality of electrically conductive microparticles. A portion of this semiconductor layer functions as a channel region. According to this manufacturing method, the field-effect transistor according to the present invention can be manufactured.

The following describes a method for forming a semiconductor layer in the manufacturing method according to the present invention. It should be noted that there are no restrictions to the methods for forming the parts besides the semiconductor layer, and known methods are applicable thereto.

First, organic semiconductor molecules (hereinafter also referred to as "organic molecules (B)") are prepared. The organic molecule (B) has a π-electron conjugated chain that is insulated by a cyclic molecule, and two end groups that are disposed at opposing ends of the π-electron conjugated chain and are to be chemically bonded to the microparticles.

Next, the plurality of the microparticles and the organic molecules (B) are brought into contact with each other in a solvent, to thereby chemically bond the microparticles and the end groups of the organic molecules (B) [step (I)]. Through this step, the microparticles are linked to one another via the π-electron conjugated chains, so that conduction paths are formed. The organic molecules (B) bonded to the microparticles correspond to the foregoing organic molecules (A). Specific examples of the organic molecules (A) and (B) will be described in Embodiment 1. The description of the microparticles already has been made above, and will not be repeated here. The solvent may be a dispersion medium of the microparticles, a dispersion medium of the organic molecules (B), a solvent that dissolves the organic molecules (B), or mixtures thereof. The solvent is selected depending on the types of microparticles and organic molecules (B). A first solvent in which the microparticles are dispersed may be a water-based solvent, an organic solvent, or an alcohol-based solvent, for example. The second solvent that dissolves the organic molecules (B) may be a water-based solvent, an organic solvent, or an alcohol-based solvent, for example.

Next, the solvent is removed [step (II)]. By removing the solvent, a semiconductor layer forms. The method for removing the solvent is not particularly restricted and any method may be employed, such as heat drying, decompression drying, and natural drying. The heating preferably should be conducted at a temperature at which the characteristics of the organic molecules do not degrade.

The following describes four examples of step (I).

The first example is as follows. Step (I) includes the step of supplying a first liquid that contains a plurality of microparticles and the first solvent, and a second liquid that contains the organic molecules (B) and the second solvent, to a region in which the semiconductor layer is to be formed, to chemically bond the microparticles and the end groups of the organic molecules (B) to one another. In the first example, the first liquid and the second liquid are supplied separately to the region in which the semiconductor layer is to be formed, and the reaction takes place in that region. In this case, the first solvent and the second solvent are removed in step (II). The first liquid containing the microparticles and the first solvent further may contain a surfactant or the like (likewise in the following examples).

The second example is as follows. Step (I) includes the step of supplying the first liquid containing the plurality of the microparticles and the first solvent to the region in which the semiconductor layer is to be formed, and thereafter removing the first solvent to form a microparticle layer. And Step (I) includes the step of supplying the second liquid containing the organic molecules (B) and the second solvent onto the microparticle layer, to chemically bond the microparticles and the end groups of the organic molecules (B). In the second example, the microparticles in the microparticle layer are dispersed into the second solvent when supplying the second liquid, and the organic molecules (B) and the microparticles react with each other in the second solvent. In the second example, the second solvent is removed in step (II).

The third example is as follows. Step (I) includes the step of supplying the second liquid containing the organic molecules (B) and the second solvent to the region in which the semiconductor layer is to be formed, and thereafter removing the second solvent to form an organic semiconductor molecule layer. And Step (I) includes the step of supplying the first liquid containing a plurality of the microparticles and the first solvent onto the organic semiconductor molecule layer to thereby chemically bond the microparticles and the end groups of the organic molecules (B). In the third example, the organic molecules (B) in the organic semiconductor molecule layer are dispersed into the first solvent when supplying the first liquid, and the organic molecules (B) and the microparticles react with each other in the first solvent. In the third example, the first solvent is removed in step (II).

It should be noted that in the second and third examples, the step of supplying the first liquid and thereafter removing the first solvent and the step of supplying the second liquid and thereafter removing the second solvent may be repeated a plurality of times alternately.

In the fourth example, the reaction product obtained through the step (I) is a gelled material. In this case, the method may further include the step of supplying the gelled material to the region in which the semiconductor layer is to be formed after step (I) but before step (II). In this case, the solvent in the gelled material is removed in the third step.

The field-effect transistor according to the present invention can be manufactured through the manufacturing method according to the present invention. The microparticles, the cyclic molecules, and the organic semiconductor molecules used in this manufacturing method, and the relationships between them are the same as those that have explained in the foregoing description of the field-effect transistor according to the present invention, and therefore are not further elaborated on. It should be noted, however, that a part of the end group (hydrogen, for example) may be detached from the organic molecules (B) when the end groups of the organic molecules (B) form chemical bonds to the microparticles. In that case, the organic molecules (B) are slightly different from the organic molecules (A) in terms of that part of the end group.

The two end groups of each of the organic molecules (B) are the end groups that are chemically bonded to the microparticles. For example, the two end groups may be composed of a —SH group (mercapto group), a —OH group, a —NH$_2$ group, a —SCH$_3$ group, and the like. The —SCH$_3$ group usually forms a coordinate bond with the metal that constitutes the microparticles. When the surface of the microparticles is composed of gold (Au), it is preferable that the end group of the organic molecules (B) be a mercapto group. Specific examples of the organic molecules (B) and the manufacturing method therefor will be described later.

In the manufacturing method according to the present invention, the main chain of the organic molecule (A) is insulated by a cyclic molecule, and therefore, the linearity of the main chain can be maintained even when the main chain length is long. Therefore, the method makes it possible to manufacture a field-effect transistor with less shorting, less leakage current, higher mobility, and better stability. This method also makes it possible to improve the resistance to oxygen and water, which has been a problem with the semiconductor layer that uses organic semiconductor molecules.

Hereinbelow, embodiments of the present invention will be described with examples thereof. It should be noted, however, that the present invention is not limited to the following embodiments.

EMBODIMENT 1

Embodiment 1 describes specific examples of a field-effect transistor (thin film transistor: TFT) according to the present invention.

FIGS. 1A to 1D are cross-sectional views schematically illustrating a representative example of the FET according to the present invention. As illustrated in FIGS. 1A to 1D, there are many variations of the FET according to the present invention. All the FETs have a substrate 11, a gate electrode 12, a gate insulating layer 13, a semiconductor layer 14, a source electrode 15, and a drain electrode 16. The gate electrode 12 faces the semiconductor layer 14 across the gate insulating layer 13. The electric field applied to the semiconductor layer 14 by the gate electrode 12 controls the ON/OFF state of the FET. The semiconductor layer 14 contains the above-described electrically conductive microparticles and the organic semiconductor molecules chemically bonded to the microparticles and insulated by cyclic molecules.

Figure 2A:
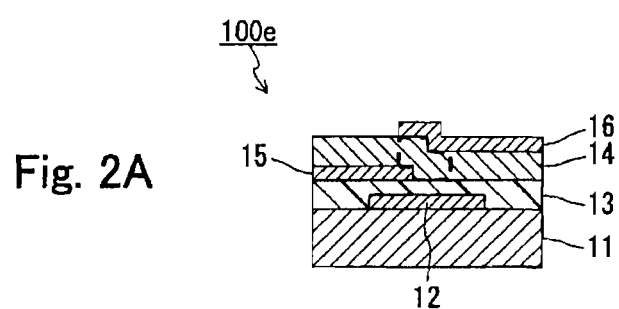
FIGS. 2A and 2B are cross-sectional views schematically illustrating another example of the FET according to the present invention.
Figure 2B:
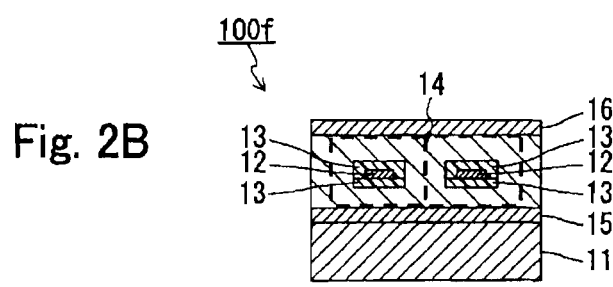

The FET according to the present invention may have the configurations as illustrated in FIGS. 2A and 2B. In the FETs 100e and 100f shown in FIGS. 2A and 2B, the source electrode 15 and the drain electrode 16 oppose each other across the semiconductor layer 14.

Figure 1B:
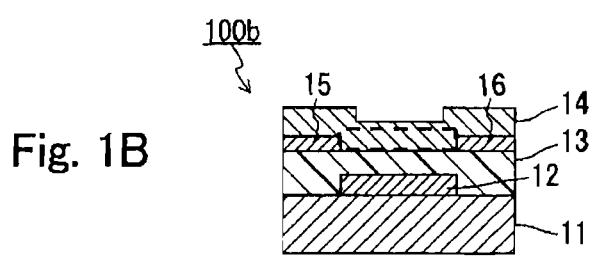
Figure 1C:
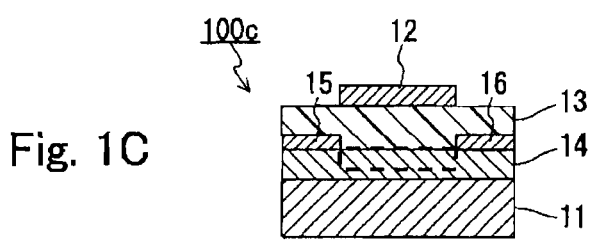

In the following, the FET 100b shown in FIG. 1B is discussed as an example. As illustrated in FIG. 1B, the gate electrode 12 is formed on one major surface of the substrate 11, and the gate insulating layer 13 is formed so as to cover the gate electrode 12. The source electrode 15 and the drain electrode 16 are formed on the gate insulating layer 13 at a distance. The semiconductor layer 14 with the above-described configuration is formed so as to cover the two electrodes and the gate insulating layer 13. Thus, in the FET 100b, the gate electrode 12, the gate insulating layer 13, the two electrodes, and the semiconductor layer 14 are stacked over the substrate 11.

Figure 1D:
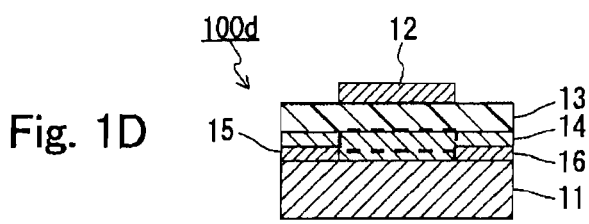

Next, the FET 100d shown in FIG. 1D is discussed as an example. In the FET 100d, the source electrode 15 and the drain electrode 16 are formed on one major surface of the substrate 11 at a certain distance. The semiconductor layer 14 is formed so as to cover the two electrodes and the substrate 11. The gate insulating layer 13 is formed on the semiconductor layer 14. The gate electrode 12 is formed on the gate insulating layer 13 at a location corresponding to at least the region between the source electrode 15 and the drain electrode 16. Thus, in the FET 100d, the two electrodes, the semiconductor layer 14, the gate insulating layer 13, and the gate electrode 12 are stacked over the substrate 11.

Hereinbelow, specific examples of the FET according to the present invention are described.

EXAMPLE 1

Example 1 describes an example in which the FET 100b shown in FIG. 1B was fabricated. In this example, a polyethylene terephthalate (hereinafter also referred to as "PET") film was used as the substrate 11. The gate electrode 12 was formed of Ni, and the source electrode 15 and the drain electrode 16 were formed of Au. The gate insulating layer 13 was formed of polyvinyl alcohol. As for the materials for forming the semiconductor layer 14, Au microparticles were used as the microparticles, a polythiophene derivative was used for the organic semiconductor molecules, and cyclodextrin was used for the cyclic molecules. The details of the average main chain length of the organic semiconductor molecules and the average particle size of the Au microparticles will be discussed later. The average main chain length of the organic semiconductor molecules was controlled by varying the mixing ratio of the molecules of the source materials. The average particle size of the Au microparticles was controlled by filtering commercially available Au microparticles having a predetermined average particle size to eliminate the microparticles having diameters larger than a predetermined diameter.

Figure 3A:
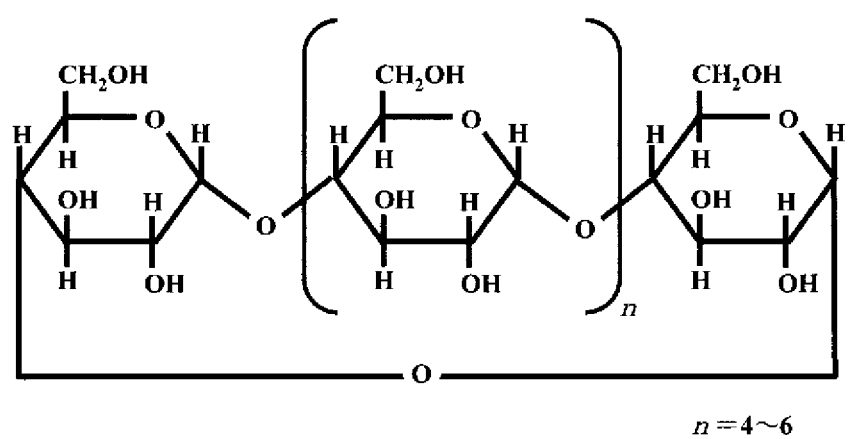
FIG. 3A illustrates the chemical formula of cyclodextrin.
Figure 3B:
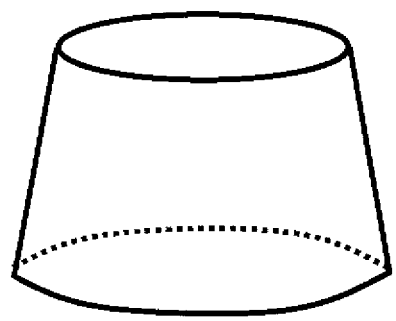
FIG. 3B is a perspective view schematically illustrating the shape of cyclodextrin.

The structure of cyclodextrin, used as the cyclic molecules, is shown in FIG. 3A. The cyclodextrin represented by the general formula shown in FIG. 3A is a cyclic oligomer of glucose, and the size of the ring structure varies depending on the number of glucoses. Popular among the cyclodextrins are α-cyclodextrin in which n=4, β-cyclodextrin in which n=5, and γ-cyclodextrin in which n=6, and any suitable one may be selected according to the size of the molecule that is to be insulated. In the drawings referred to below, cyclodextrin may be schematically represented in the manner shown in FIG. 3B.

Figures 4A, 4B:
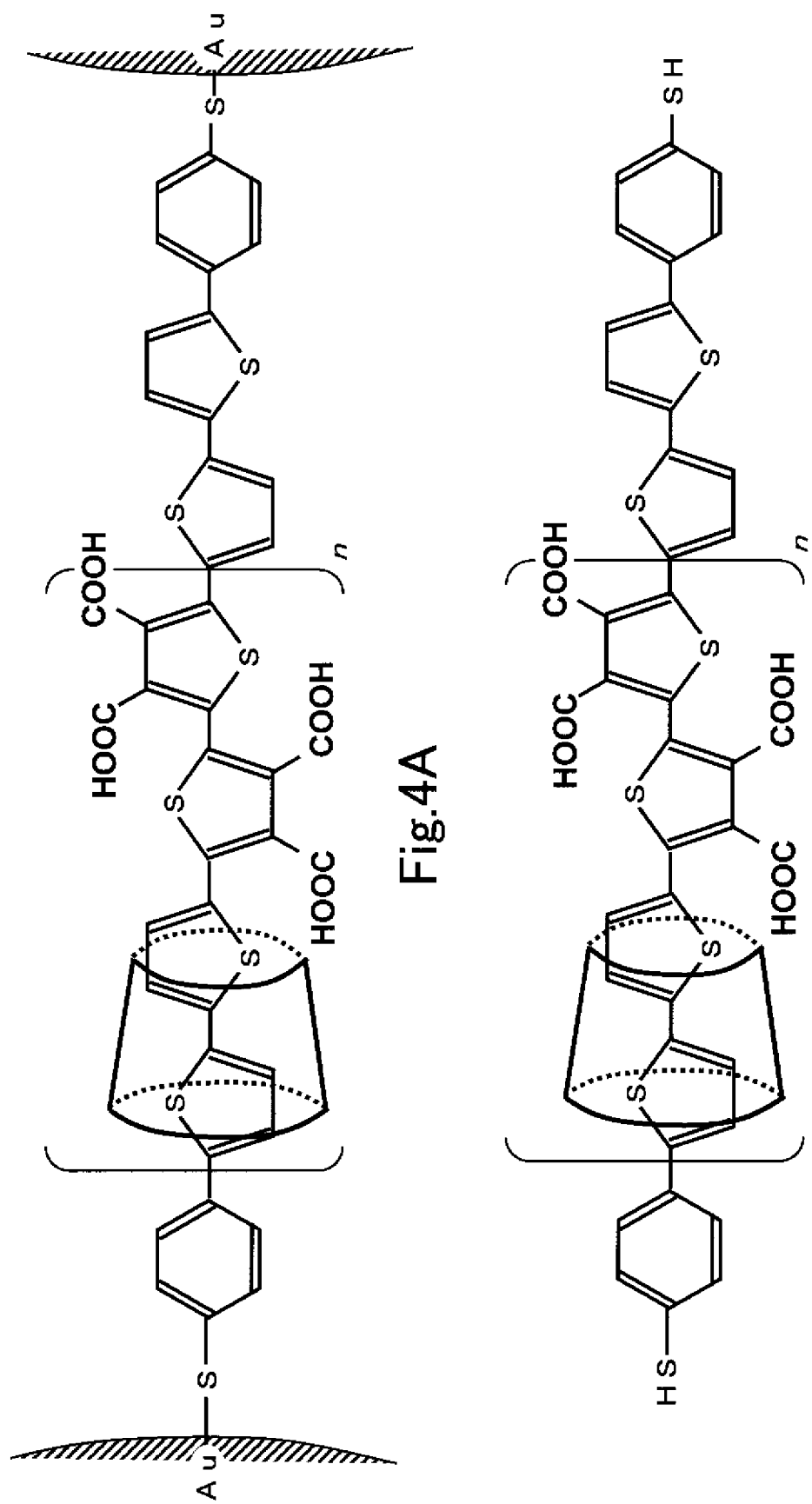
FIG. 4A is a schematic view illustrating the state of one example of the organic semiconductor molecule used in the present invention, being in a semiconductor layer.
FIG. 4B illustrates the molecule shown in FIG. 4A before bonding to microparticles of gold.

The state of the organic molecule (A) in Example 1 is illustrated in FIG. 4A. In the organic molecule (A), a portion of the repeating units is covered by cyclodextrin. It should be noted that the orientation of the cyclodextrin is not limited to the orientation shown in the figure (likewise in the rest of the figures). In Example 1, the organic molecule (A) was synthesized so that one β-cyclodextrin was provided per four thiophene rings, as illustrated in FIG. 4A. It should be noted, however, that in some cases there may be slight variations in the ratio of the thiophene ring and the cyclodextrin. The method of the synthesis will be detailed later. The opposing ends of the polythiophene are chemically bonded to the Au atoms of the microparticles via the sulfur atoms derived from the mercapto groups. The molecule shown in FIG. 4B depicts an organic molecule (B) before bonded to the microparticles.

Figure 5:
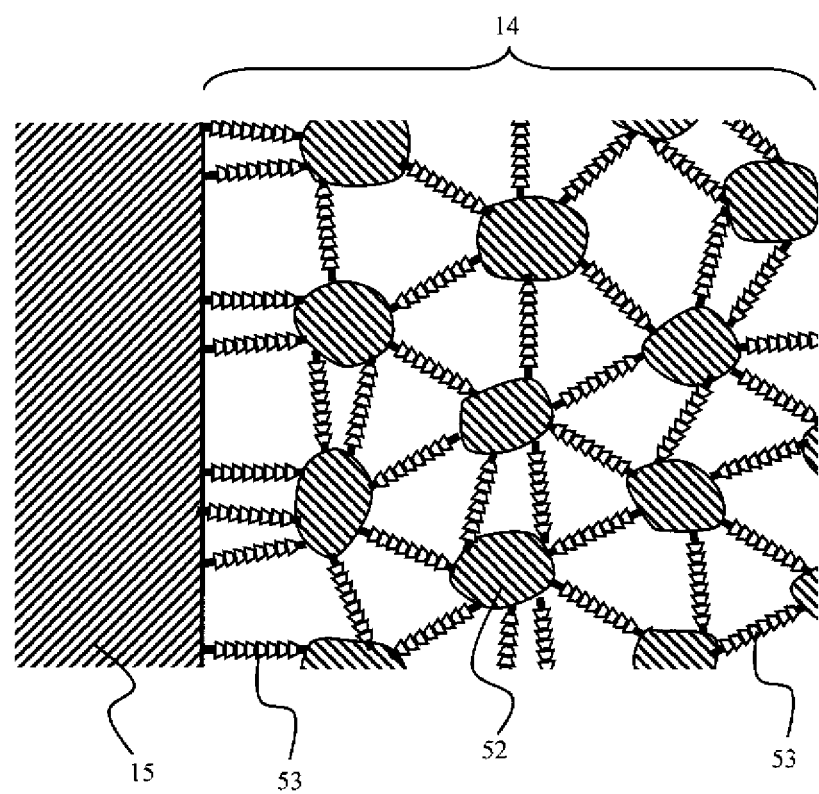
[FIG. 5]

The state of the semiconductor layer 14 in the vicinity of the source electrode is schematically illustrated in FIG. 5. In the semiconductor layer 14, the organic molecules 53 insulated by cyclodextrin are bonded to the Au microparticles 52 via the sulfur atoms at their ends. The two ends of each organic molecule 53 are bonded to different Au microparticles 52, whereby a mesh-like network is formed. It should be noted that although FIG. 5 schematically illustrates a two-dimensional network, the conduction path network actually formed is three-dimensional. The organic molecules 53 also may be chemically bonded to the source electrode 51 made of Au.

The following describes a manufacturing method of the FET 100b of Example 1. First, a Ni electrode (thickness 100 nm) serving as the gate electrode 12 was formed in a predetermined shape on a PET substrate (thickness 100 μm) by mask evaporation. Next, an aqueous solution of polyvinyl alcohol was applied thereto by spin coating and then dried, to form the gate insulating layer 13 (thickness 500 nm). Subsequently, the source electrode 15 and the drain electrode 16 were formed in predetermined shapes on the gate insulating layer 13 by mask evaporation. Specifically, the source and drain electrodes (thickness 100 nm) made of Au were formed so that the channel length was 50 μm and the channel width was 500 μm.

Next, an aqueous dispersion of the Au microparticles and an aqueous solution of the organic molecules as shown in FIG. 4B were applied successively to the region in which the semiconductor layer 14 was to be formed. Thereafter, the solvent (water) was evaporated by heating at 105° C., thus forming the semiconductor layer 14 (thickness 500 nm).

In this way, the FET 100b was fabricated. In addition, FETs of comparative examples were fabricated in the same manner as described above, except that the molecules as shown in FIG. 4B but not insulated by cyclodextrin were used as the organic molecules (A). In Example 1, a plurality of types of FET samples was fabricated by varying the particle size of the Au microparticles and the average main chain length of the organic semiconductor molecules. The thickness of the semiconductor layer was the same in all the samples of the FETs.

The samples of the FETs fabricated in the above-described manners were evaluated for their carrier mobilities and the ON/OFF ratios of the source-drain currents. The current value Ids flowing between the source and the drain was measured with a fixed source-drain voltage Vds of −30 V while sweeping the source-gate voltage Vgs from +50 V to −80 V. The carrier mobility was calculated from the measured current value Ids. The source-drain voltage Vds −30 V was determined since the current Ids reaches the saturation current at that voltage in the sweep range of the source-gate voltage Vgs. The ON/OFF ratio was defined as the ratio between the current value Ids at a source-gate voltage Vgs of +20 V, being a threshold voltage, and the current value Ids at a source-gate voltage Vgs of −20 V, being a threshold voltage. Tables 1 and 2 below show the evaluation results for the relationship between the average particle size of the microparticles constituting the semiconductor layer and the average main chain length of the organic semiconductor molecules (chain molecules) versus the carrier mobility and the ON/OFF ratio. Table 1 shows the results for the FETs according to the present invention, and Table 2 shows the results for the FETs of the comparative examples.

TABLE 1

| Examples | | Average particle size of microparticles (nm) | | | | | |
|---|---|---|---|---|---|---|---|
| | | approx. 10 | approx. 20 | approx. 30 | approx. 60 | approx. 100 | approx. 150 |
| Average main chain length of chain molecules (nm) | approx. 3.5 | — | — | — | — | — | — |
| | approx. 5 | 5.1 ($1 \times 10^2$) | 9.6 ($4 \times 10$) | — | — | — | — |
| | approx. 10 | 2.8 ($4 \times 10^4$) | 4.9 ($3 \times 10^2$) | 7.1 ($8 \times 10$) | — | — | — |
| | approx. 20 | 1.6 ($1 \times 10^5$) | 2.7 ($6 \times 10^4$) | 3.8 ($5 \times 10^2$) | 7.4 ($1 \times 10^2$) | — | — |
| | approx. 30 | 1.3 ($5 \times 10^5$) | 1.9 ($2 \times 10^5$) | 2.5 ($5 \times 10^4$) | 5.3 ($2 \times 10^2$) | 8.3 ($5 \times 10$) | — |

Upper row: Carrier mobility ($cm^2/V \cdot s$)
Lower row: ON/OFF ratio

TABLE 2

| Comparative Examples | | Average particle size of microparticles (nm) | | |
|---|---|---|---|---|
| | | approx. 10 | approx. 20 | approx. 30 |
| Average main chain length of chain molecules (nm) | approx. 3.5 | — | — | — |
| | approx. 5 | 3.5 ($8 \times 10$) | 6.7 ($2 \times 10$) | — |
| | approx. 10 | 1.2 ($3 \times 10^2$) | 2.0 ($8 \times 10$) | — |
| | approx. 20 | 0.4 ($5 \times 10^2$) | 0.7 ($2 \times 10^2$) | — |
| | approx. 30 | 0.2 ($6 \times 10^2$) | 0.5 ($4 \times 10^2$) | — |

Upper row: Carrier mobility ($cm^2/V \cdot s$)
Lower row: ON/OFF ratio

In Tables 1 and 2, the symbol "—" indicates that the FET characteristics were not available due to source-drain short circuits. With the FETs of the comparative examples, when the average particle size of the microparticles was 30 nm or greater therein, shorting between source and drain occurred so the FET characteristics were unavailable. Moreover, even when the FET characteristics were available, the FETs of the comparative examples showed low ON/OFF ratios of the source-drain currents, 600 or less. Furthermore, the FETs of the comparative examples showed lower carrier mobilities than the FETs according to the present invention.

In the FETs of the comparative examples, the organic semiconductor molecules were not insulated by cyclic molecules. Therefore, it is believed that when the average main chain length of the organic semiconductor molecules is long, the FETs of the comparative examples cannot maintain the linearity of the organic semiconductor molecules, resulting in a bent molecular structure. Accordingly, it is believed that the FETs of the comparative examples have shorter effective average main chain lengths of the organic semiconductor molecules, which result in poorer characteristics.

In contrast, in the FETs according to the present invention, the FET characteristics were available with the organic semiconductor molecules having an average main chain length of 30 nm even when the average particle size of the microparticles was 100 nm. However, it is not easy to synthesize long-chain molecules having an average main chain length of longer than 30 nm with the use of the organic semiconductor molecules used in Example 1, and moreover, even if the synthesis is possible, the molecules will have poor stability and require many constraints on the process. For this reason, it is preferable that the average main chain length of the organic semiconductor molecules be about 30 nm or less. Thus, when the organic semiconductor molecules of Example 1 are used, it is not easy to obtain FET characteristics in the case that the average particle size of the microparticles exceeds 100 nm.

In the FETs of the present invention, the ON/OFF ratio was 10000 or greater when the average main chain length of the organic molecules (A) was equal to or greater than the average particle size of the microparticles. In the FETs of the present invention, there is a trade-off between the carrier mobility and the ON/OFF ratio, so it is preferable that the carrier mobility and the ON/OFF ratio be optimized depending on the intended application. It should be noted that the carrier mobility obtained by the FETs of the present invention is sufficiently higher than the carrier mobility that can be obtained by common organic FETs formed through a coating process.

EXAMPLE 2

Example 2 describes one example in which the FET 100*d* shown in FIG. 1D was fabricated. In this example, the materials for the constituent components of the FET were the same as the materials used in Example 1. The average particle size of the Au microparticles was about 20 nm, and the average main chain length of the organic semiconductor molecules was about 30 nm.

The following describes a manufacturing method of the FET 100*d* of Example 2. First, the source electrode 15 and the drain electrode 16 were formed in predetermined shapes on a PET substrate (thickness 100 μm) by mask evaporation. Specifically, the source and drain electrodes (thickness 100 nm) made of Au were formed so that the channel length was 50 μm and the channel width was 500 μm.

Next, an aqueous dispersion of the Au microparticles was applied onto the region in which the semiconductor layer 14 was to be formed, and the solvent was evaporated by heating at 105° C., thus forming a layer of the Au microparticles. Subsequently, an aqueous solution of the molecules as shown in FIG. 4B was applied onto the layer of the Au microparticles so as to bond the Au microparticles and the organic molecules of FIG. 4B to one another. Next, the solvent was evaporated by heating at 105° C. again, whereby the semiconductor layer 14 (thickness 500 nm) was formed.

Then, an aqueous solution of polyvinyl alcohol was applied thereto by spin coating and thereafter dried to form the gate insulating layer 13 (thickness 500 nm). Next, a Ni electrode (thickness 100 nm) as the gate electrode 12 was formed by mask evaporation. In this way, the FET 100*b* was fabricated.

The carrier mobility and the ON/OFF ratio were evaluated in the same manner as described in Example 1. As a result, the carrier mobility was found to be 1.7 cm$^2$/Vs and the ON/OFF ratio was $3 \times 10^5$.

EXAMPLE 3

Example 3 describes one example in which the FET 100*e* shown in FIG. 2A was fabricated. In this example, the materials for the constituent components of the FET were the same as the materials used in Example 1. The average particle size of the Au microparticles was about 20 nm, and the average main chain length of the organic semiconductor molecules was about 30 nm.

The following describes a manufacturing method of the FET 100*e* of Example 3. First, a Ni electrode (thickness 100 nm) serving as the gate electrode 12 was formed in a predetermined shape on a PET substrate (thickness 100 μm) by mask evaporation. Next, an aqueous solution of polyvinyl alcohol was applied thereto by spin coating and thereafter dried to form the gate insulating layer 13 (thickness 500 nm). Subsequently, the source electrode 15 was formed in a predetermined shape on the gate insulating layer 13 by mask evaporation.

Next, an aqueous dispersion of Au microparticles and an aqueous solution of the organic semiconductor molecules as shown in FIG. 4B were mixed to obtain a gelled material. The resultant gelled material was applied to the region in which the semiconductor layer 14 was to be formed, and the liquid component was evaporated by heating at 105° C., whereby the semiconductor layer 14 (thickness 500 nm) was formed.

Next, the drain electrode 16 (thickness 100 nm) made of Au was formed by mask evaporation. The drain electrode 16 was formed so that the channel width became 100 μm. In the FET 100*e* of this example, the channel length was the thickness of the semiconductor layer 14 (500 nm). In this way, the FET 100*e* was fabricated.

The carrier mobility and the ON/OFF ratio were evaluated in the same manner as described in Example 1. As a result, the carrier mobility was found to be 1.4 cm$^2$/Vs and the ON/OFF ratio was $2 \times 10^4$. However, since the FET of Example 3 had a shorter channel length than those of the FETs of Examples 1 and 2, the measurement was conducted with the source-drain voltage Vds being fixed at −3 V.

Figure 6:
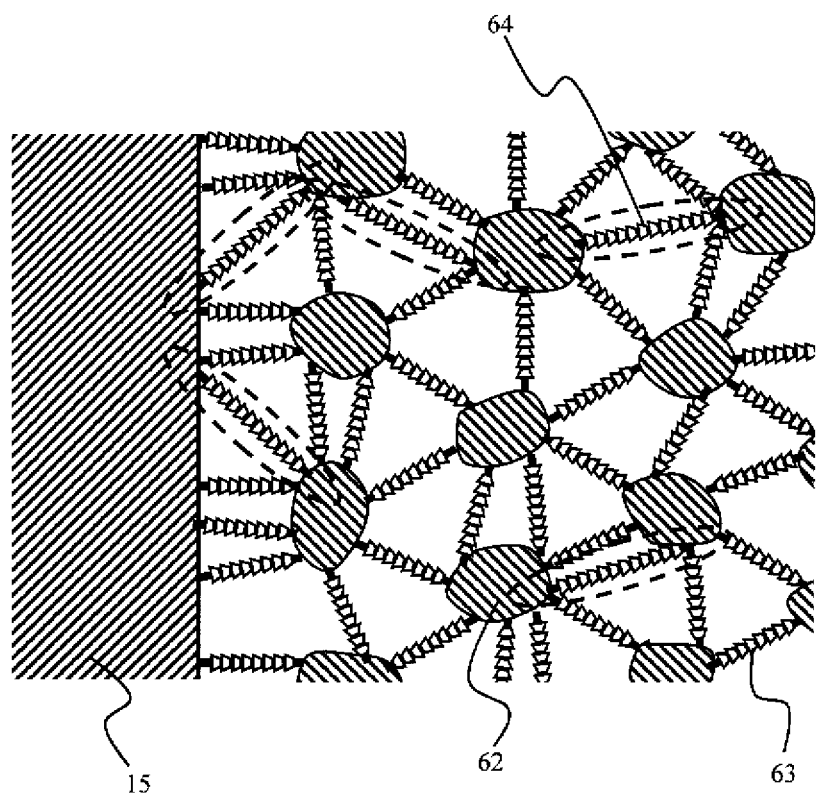
[FIG. 6]

It should be noted that although the foregoing examples use the organic semiconductor molecules in which the main chain length is substantially uniform, it is possible to use a plurality of types of organic semiconductor molecules having different main chain lengths that have been mixed at an appropriate mixing ratio. For example, as illustrated in FIG. 6, the organic semiconductor molecules may include main organic semiconductor molecules 63 with a predetermined main chain length and organic semiconductor molecules 64 with a longer main chain length, mixed with the organic semiconductor molecules 63. As a result, microparticles 62 are bonded by a larger number of organic semiconductor molecules than in the case of FIG. 5, so the electric current that is allowed to pass through the semiconductor layer can be increased. The chain lengths of the molecules that are mixed together are not limited, but it is preferable that the chain length of the main organic semiconductor molecules be the shortest of the types of the molecules mixed together. In that case, the main organic semiconductor molecules form a network containing the microparticles, and the organic semiconductor molecules longer than the main organic semiconductor molecules are utilized so as to fill in the gap spaces in the network.

In addition, although the foregoing examples have described only the cases in which the organic semiconductor molecules as shown in FIG. 4B were used, the organic semiconductor molecules that may be used in the present invention are not limited thereto. For example, it is also possible to use the compound shown in FIG. 7A or the compound shown in FIG. 7B. Examples of the synthesizing method for these compounds will be detailed later.

Figure 7A:
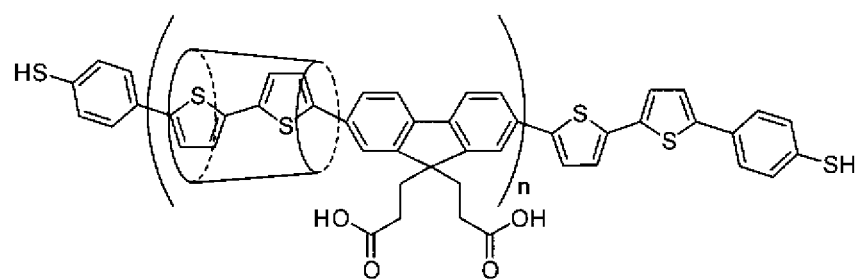
FIGS. 7A and 7B illustrate other examples of the organic semiconductor molecule used in the present invention.
Figure 7B:
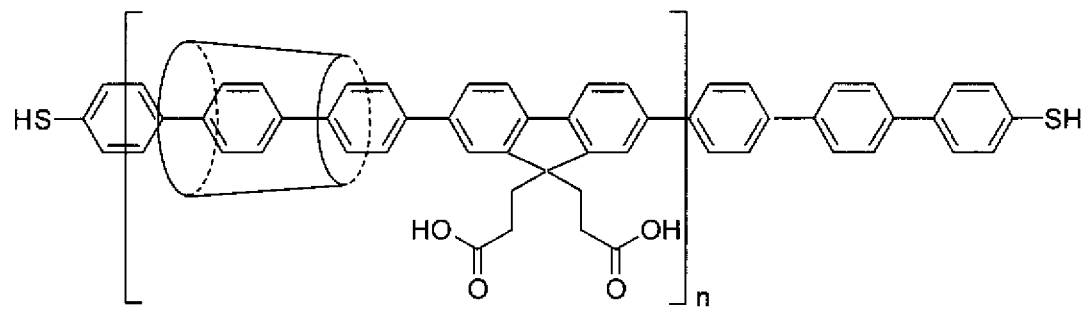

It is sufficient that the cyclic molecule cover only a portion of the organic semiconductor molecule, as illustrated in FIGS. 7A and 7B, as long as the linearity of the organic semiconductor molecule is ensured to a certain degree. It is preferable, however, that more than 30% of the main chain length of the π-electron conjugated chain be covered by the cyclic molecule, in order to enhance the linearity of the organic semiconductor molecule.

It is possible to use derivatives of acetylene-based molecules such as polyacethylene and polyphenylacetylene for the organic molecules (A) and (B) (conjugated π-electron-based molecules). It is also possible to use condensed ring aromatic hydrocarbons and derivatives thereof. Examples include derivatives of molecules of the acene series such as tetracene and hexacene, and derivatives of molecules of the phene series such as phenanthrene and chrysene. It is also possible to use derivatives of pyrrole-based molecules such as polypyrrole and polyalkylpyrrole, or derivatives of phenylene-based molecules such as oligophenylene and polyphenylene. Further, it is possible to use copolymer derivatives of combinations of the just-mentioned molecules, or combinations of vinyl groups and ethynyl groups. In addition, side chains may be introduced partially to the main chains of the molecules such as described above.

Figure 8:
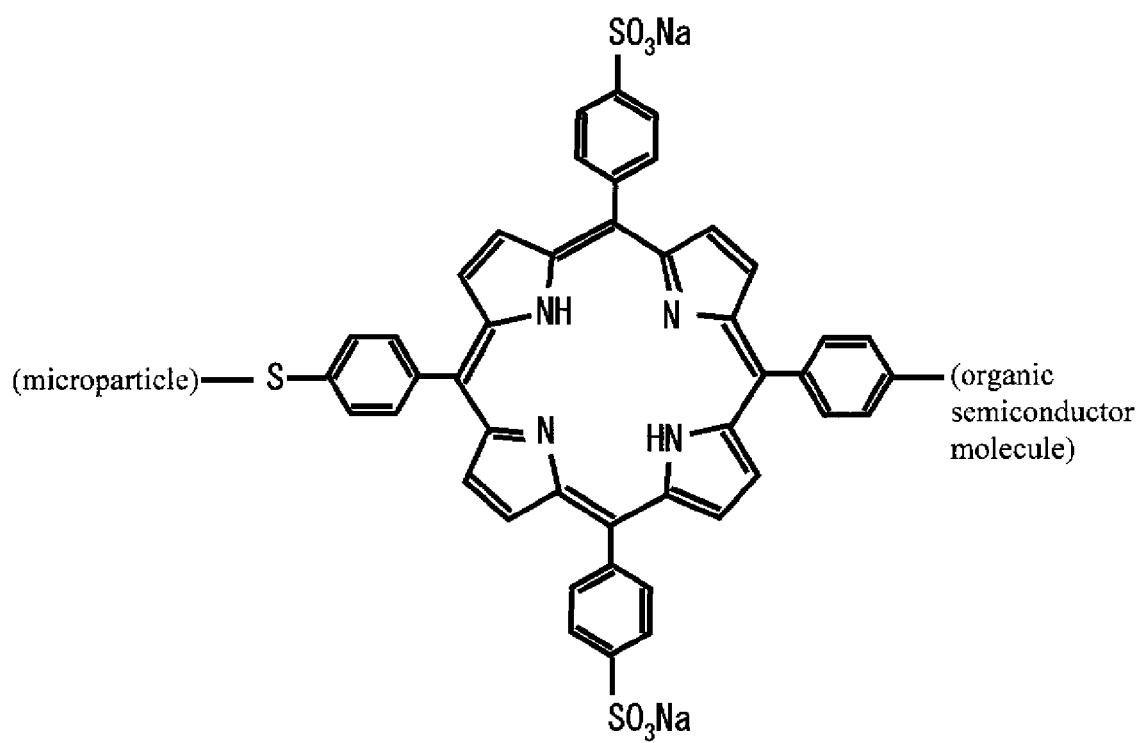
[FIG. 8]

It should be noted that although the foregoing examples have described the cases in which the conjugated chain insulated by a cyclic molecule is chemically bonded to Au atoms via the sulfur atoms derived from the mercapto groups, the configuration of the ends of the organic semiconductor molecule is not limited thereto. For example, as illustrated in FIG. 8, it is possible to interpose a bulky molecule such as a porphyrin derivative between the organic semiconductor molecule and the microparticle. By modifying the end of the organic semiconductor molecule with such a bulky molecule, it is possible to prevent the cyclic molecules that insulate the organic semiconductor molecules from being detached during the formation of the semiconductor layer.

Although the foregoing examples have been described to use the Au microparticles as the microparticles, it should be understood that this does not limit the present invention. The same advantageous effects are obtained even when microparticles of Ag, Cu, Pt, and the like are used in place of the Au microparticles. The end groups of the organic semiconductor molecule may be selected appropriately depending on the types of the microparticles. Examples of the preferable combinations of the metal that forms the surface of the microparticles and the end group (metal/end group) include Au/—SH, Pt/—SH, and Ca/—OH. As for the foregoing elements to be selected, it is possible to replace the sulfur atom with Se or Te, since the elements belonging to the same period of the periodic table exhibit similar properties.

EMBODIMENT 2

Embodiment 2 describes an active matrix-type display, a wireless ID tag, and mobile devices as examples of the device equipped with the FET that has been described in Embodiment 1 according to the present invention.

Figure 9:
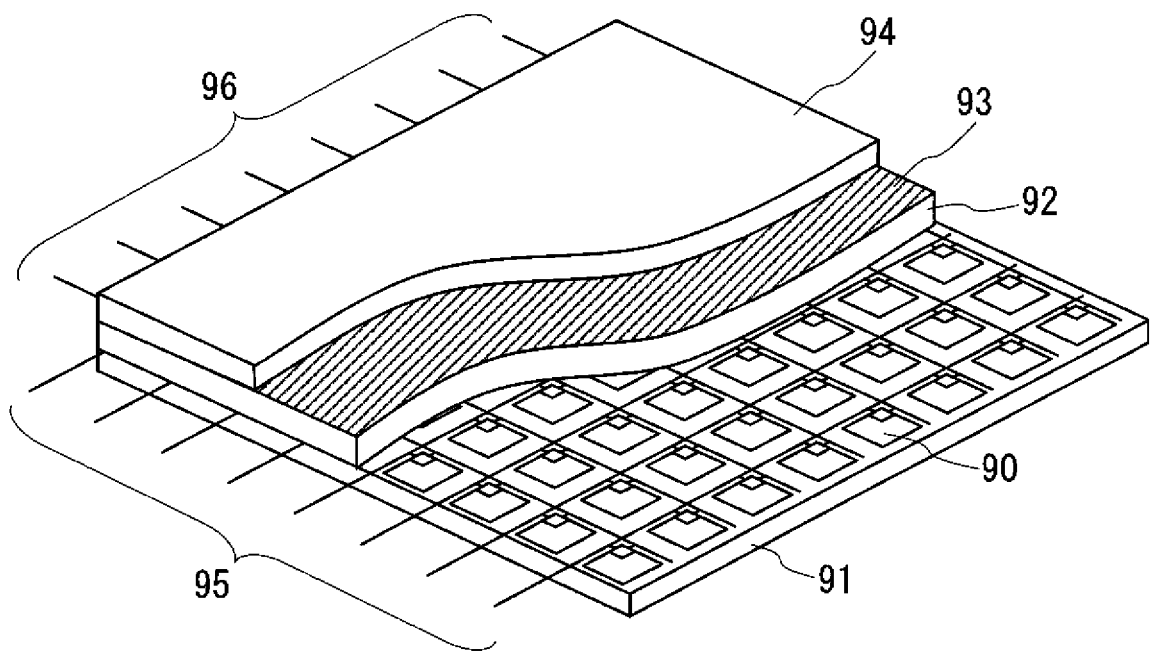
[FIG. 9]

A display using an organic EL for the display unit will be described as one example of the active matrix-type display. FIG. 9 shows a partially exploded perspective view schematically illustrating the configuration of the display.

The display illustrated in FIG. 9 has a drive circuit 90 disposed on a plastic substrate 91 in an array form. The drive circuit 90 includes FETs according to the present invention, and they are connected to pixel electrodes. An organic EL layer 92, a transparent electrode 93, and a passivation film 94 are disposed over the drive circuit 90. The organic EL layer 92 has a structure in which a plurality of layers are stacked, such as an electron transport layer, a light-emitting layer, and a hole transport layer. Source lines 95 and gate lines 96, which are connected to the respective electrodes of the FETs, are connected respectively to a control circuit (not shown).

Figure 10:
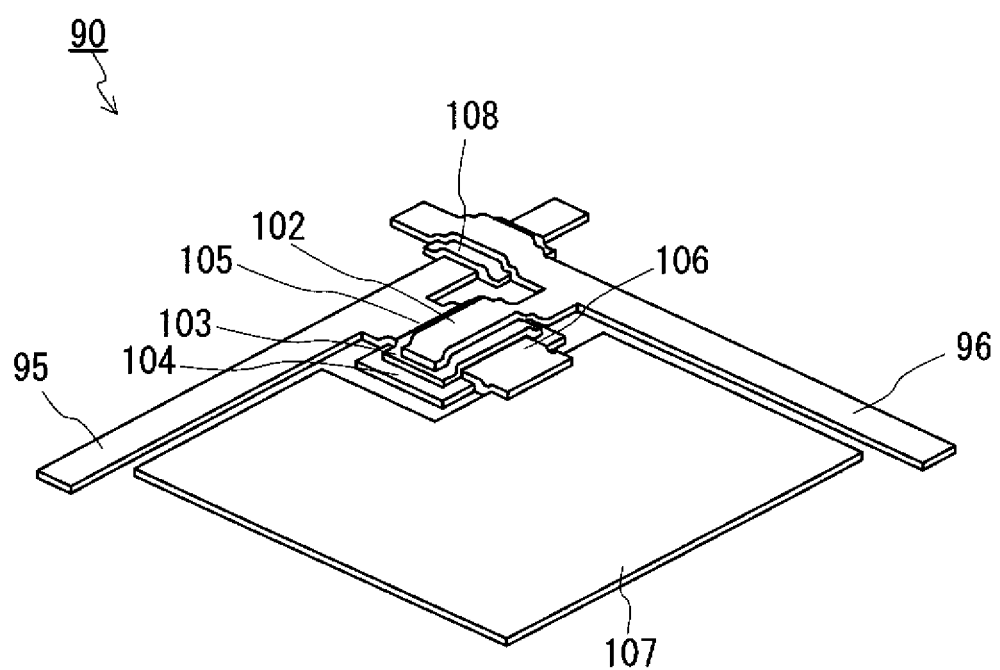
[FIG. 10]

FIG. 10 illustrates an enlarged view of one example of the drive circuit 90 and its periphery. The structure of the FET shown in FIG. 10 is basically the same as the structure shown in FIG. 1C. Specifically, in the FET shown in FIG. 10, a semiconductor layer 104, a source electrode 105 and a drain electrode 106, a gate insulating layer 103, and a gate electrode 102 are stacked over the substrate. The drain electrode 106 is connected electrically to a pixel electrode 107 of the organic EL. An insulating layer 108 is formed at the part at which a gate line 96, to which the gate electrode 102 is connected, intersects with a source line 95, to which the source electrode 105 is connected. The semiconductor layer 104 is a semiconductor layer as described in Embodiment 1.

The FET of the present invention, which achieves a high carrier mobility, makes available an active matrix display with a fast display speed (fast response speed) at low cost. Moreover, the use of the FET of the present invention makes available a sheet-like display having flexibility and shock resistance.

It should be noted that although this embodiment has discussed a case in which the display unit is an organic EL, the present invention is not limited thereto. The present invention may be applied to other active matrix-type displays equipped with a circuit that contains FETs, which will yield the same advantageous effects.

In addition, the configuration of the driving circuit unit for driving pixels is not limited to the configuration shown in this embodiment. For example, it is possible to employ a configuration in which a current driving FET and a switching FET for controlling the current driving FET are combined to drive one pixel. Moreover, it is possible to employ a configuration in which an even greater number of FETs are combined. Furthermore, the FET is not limited to the FET shown in this embodiment, but other FETs according to the present invention may be employed, in which case the same advantageous effects can be obtained as well.

Figure 11:
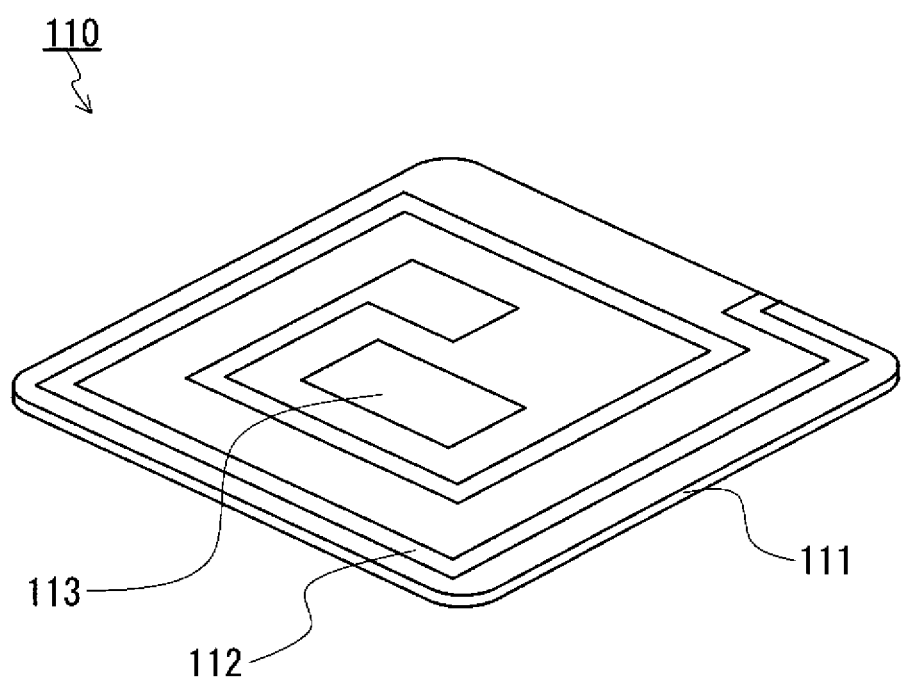
[FIG. 11]

Next, the following describes a case in which the FET according to the present invention is used for a wireless ID tag. FIG. 11 schematically illustrates a perspective view of one example of the wireless ID tag that utilizes the FET according to the present invention. It should be noted that FIG. 11 does not show some components such as wires for connecting an antenna unit and a memory IC unit and a matching circuit.

As illustrated in FIG. 11, a wireless ID tag 110 employs a film-like plastic substrate 111 as the substrate. An antenna unit 112 and a memory IC unit 113 are provided on this substrate 111. Here, the memory IC unit 113 is constructed with the FETs according to the present invention as described in Embodiment 1. The back side of the substrate of the wireless ID tag 110 is provided with an adhesive property so that it can be adhered even onto non-flat items, such as beverage cans or bags for confectionery or snack items. In addition, a protective film may be provided on the surface of the wireless ID tag 110 as necessary.

Thus, the use of the FET according to the present invention makes it possible to obtain wireless ID tags having various shapes and being capable of adhering to items made of various materials. Moreover, the use of the FET according to the present invention, which has a high carrier mobility, enables wireless ID tags having fast response speed (processing speed) and with a high communication frequency to be obtained.

It should be noted that the wireless ID tag according to the present invention is not limited to the wireless ID tag as shown in FIG. 11. Accordingly, there are no restrictions to the arrangements and configurations of the antenna unit and the memory IC unit. For example, it is possible to incorporate a security circuit into the wireless ID tag.

Furthermore, although this embodiment has discussed a case in which the antenna unit 112 and the memory IC unit 113 are formed on the plastic substrate 111, the present invention is not limited to this embodiment. For example, the antenna unit 112 and the memory IC unit 113 may be directly formed on a target item by using a technique such as ink jet printing. In that case as well, by forming the FET according to the present invention, it becomes possible to manufacture a wireless ID tag having a FET with an improved carrier mobility at low cost.

Next, the following describes mobile devices equipped with an integrated circuit having the FET of the present invention. The integrated circuit of the mobile devices has various device elements such as arithmetic elements, memory elements, and switching elements, that utilize the properties of semiconductor. Using the FET according to the present invention for at least a portion of these elements makes it possible to fabricate the mobile devices that are excellent in characteristics such as mechanical flexibility, shock resistance, safety to environment upon disposal, being lightweight, and being low-cost, which are among the advantages of organic materials.

Figure 12:
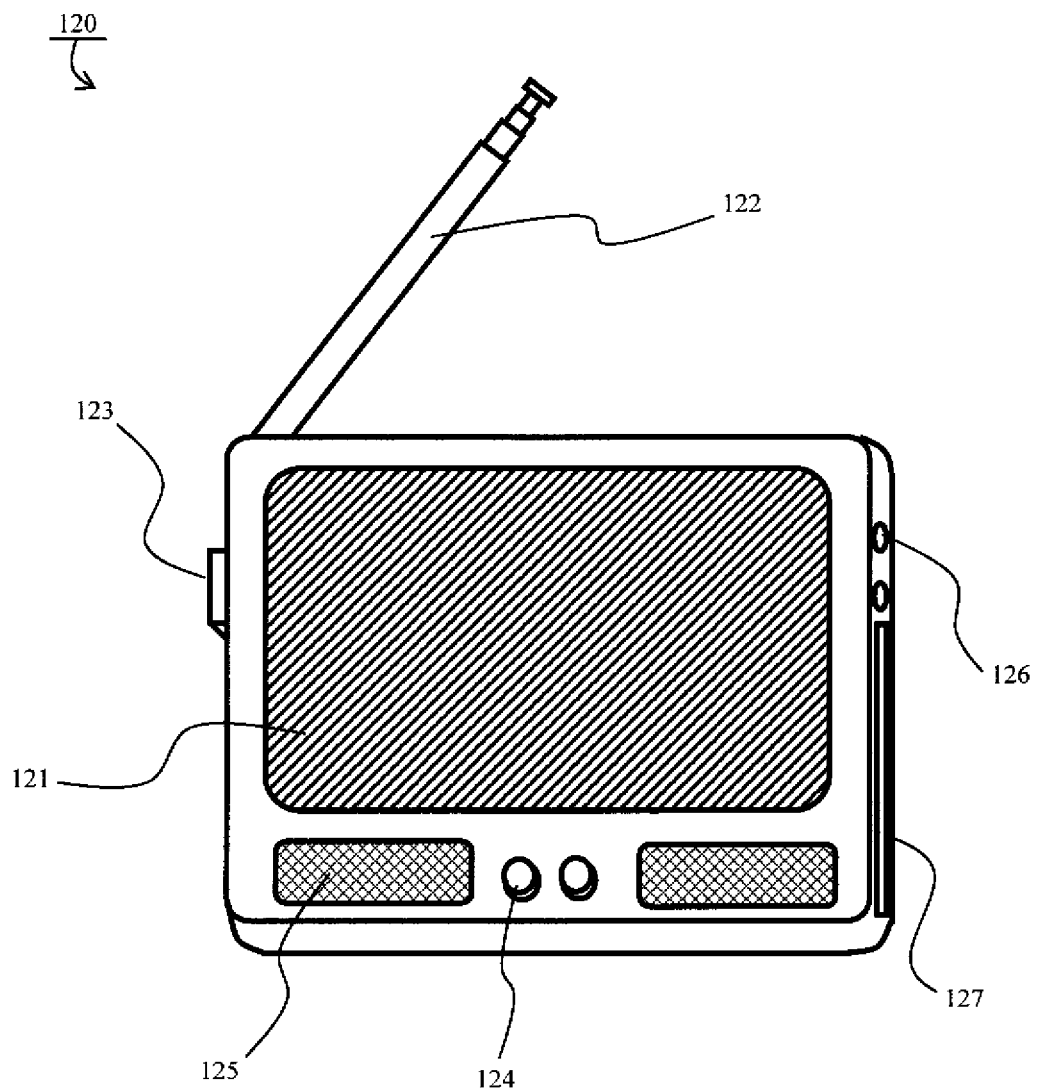
[FIG. 12]
Figure 13:
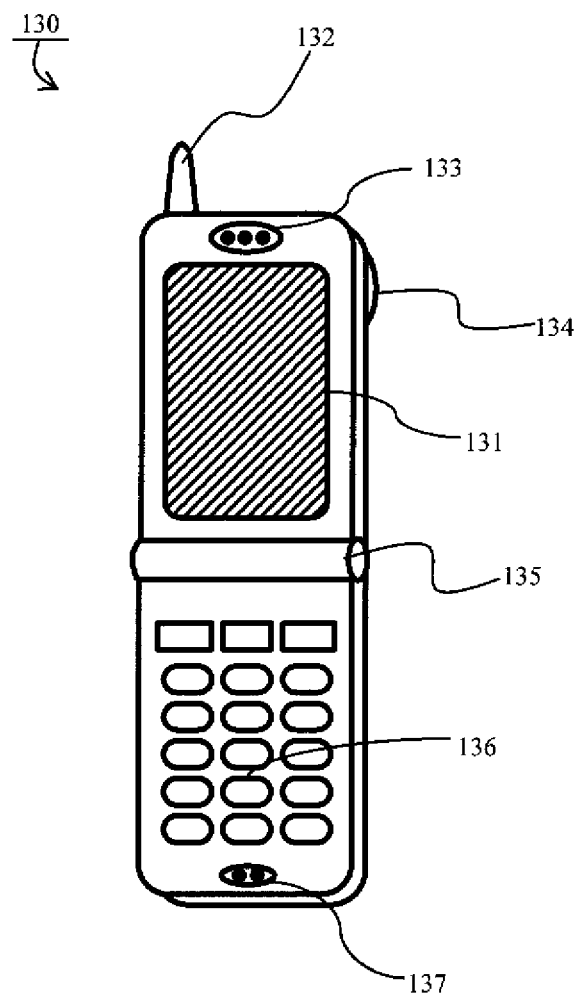
[FIG. 13]
Figure 14:
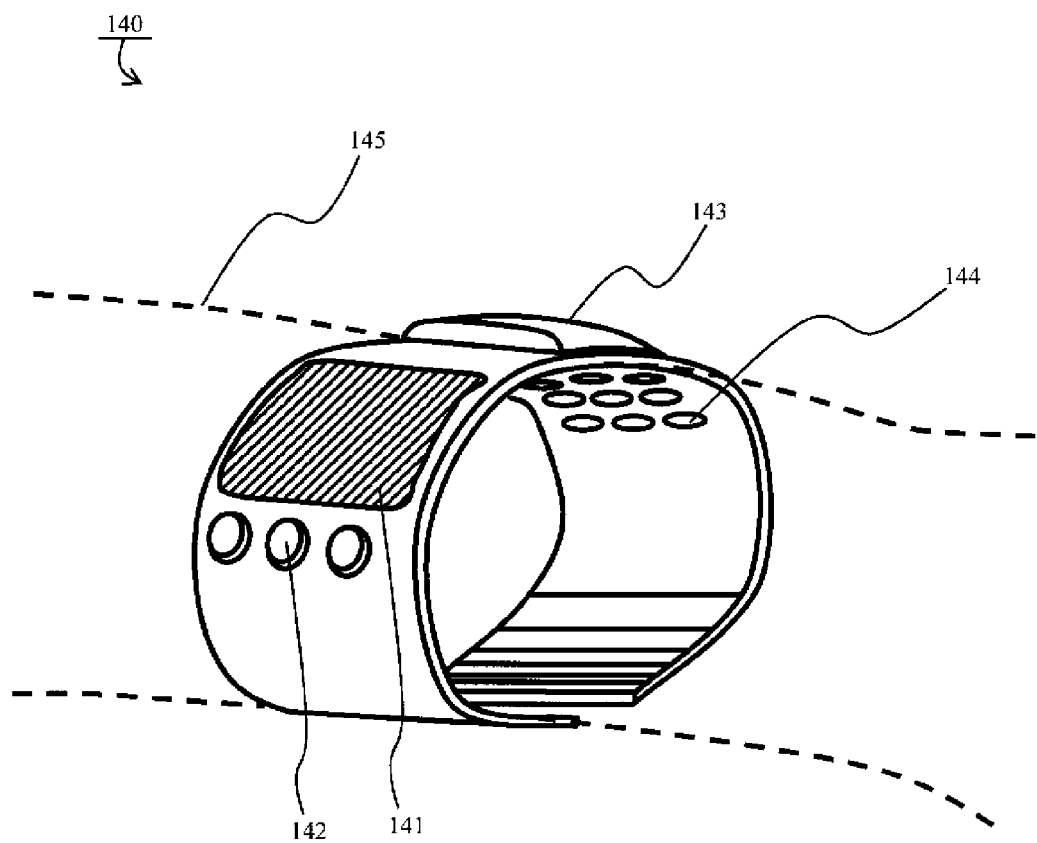
[FIG. 14]

FIGS. 12 to 14 illustrate three types of mobile devices as examples of the electronic device according to the present invention.

A portable television 120 shown in FIG. 12 is furnished with a display device 121, a receiver device 122, a side switch 123, front switches 124, an audio output unit 125, an input/output device 126, and a recording media slot 127. An integrated circuit containing the FET according to the present invention is used as a circuit that contains such elements as arithmetic elements, memory elements, and switching elements that constitute the portable television 120.

A telecommunication terminal 130 shown in FIG. 13 is furnished with a display device 131, a transceiver device 132, an audio output unit 133, a camera unit 134, a movable hinge joint part 135, control buttons 136, and an audio input unit 137. An integrated circuit containing the FET according to the present invention is used as a circuit that contains such elements as arithmetic elements, memory elements, and switching elements that constitute the telecommunication terminal 130.

A portable medical device 140 shown in FIG. 14 is furnished with a display device 141, control buttons 142, a medical treatment unit 143, and percutaneous contact portions 144. The portable medical device 140 may be carried about while being wrapped around a human arm 145. The medical treatment unit 143 is a part that processes biometric information obtained through the percutaneous contact portions 144 and performs medical treatments such as providing drugs through the percutaneous contact portions 144. The integrated circuit containing the FET according to the present invention is used as a circuit that contains such elements as arithmetic elements, memory elements, and switching elements that constitute the portable medical device 140.

Although examples of the configurations of the electronic devices that employ the FET according to the present invention have been illustrated, it should be understood that these embodiments do not limit the present invention. Moreover, the electronic devices to which the FET according to the present invention can be applied are not limited to the devices illustrated above. The FET according to the present invention can be applied suitably to various devices such as PDA terminals, wearable AV devices, portable computers) and wrist watch-type telecommunication devices, which require such characteristics as mechanical flexibility, shock resistance, safety to the environment when disposal, being lightweight, and being low-cost.

[Method for Calculating Average Particle Size]

Figure 15A:
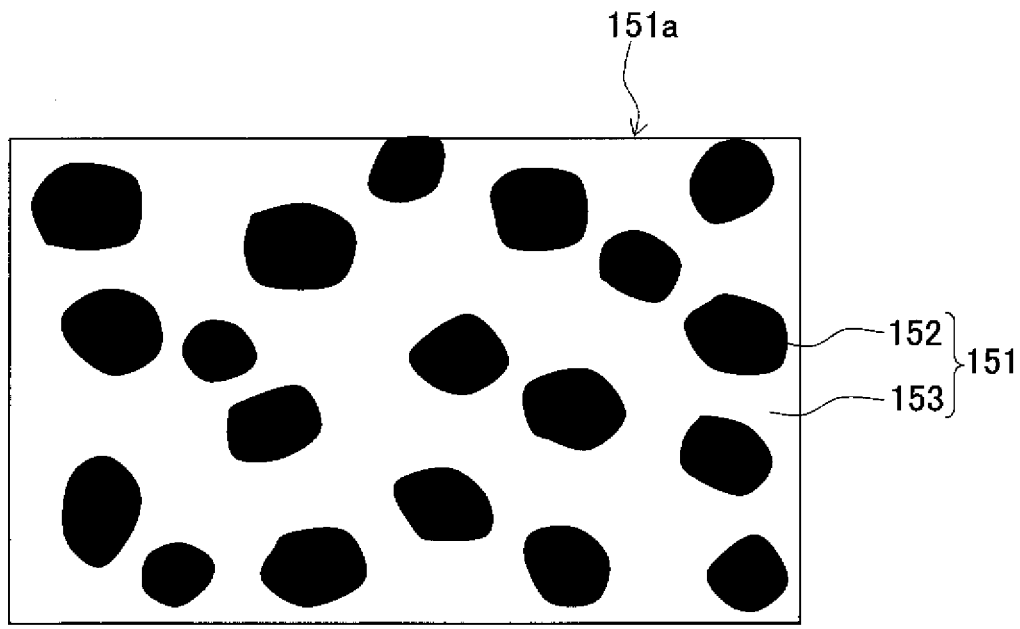
FIG. 15A illustrates one example of a cross section of the semiconductor layer.

The following describes a method for calculating the average particle size of the microparticles in the semiconductor layer. First, a cross section of a portion of the semiconductor layer is photographed. FIG. 15A schematically illustrates a cross section of a portion of a semiconductor layer 151 that constitutes a FET. By observing a cross section 151$a$ of the semiconductor layer 151, the state of the electrically conductive microparticles 152 dispersed in the organic semiconductor material 153 can be confirmed easily.

Figure 15B:
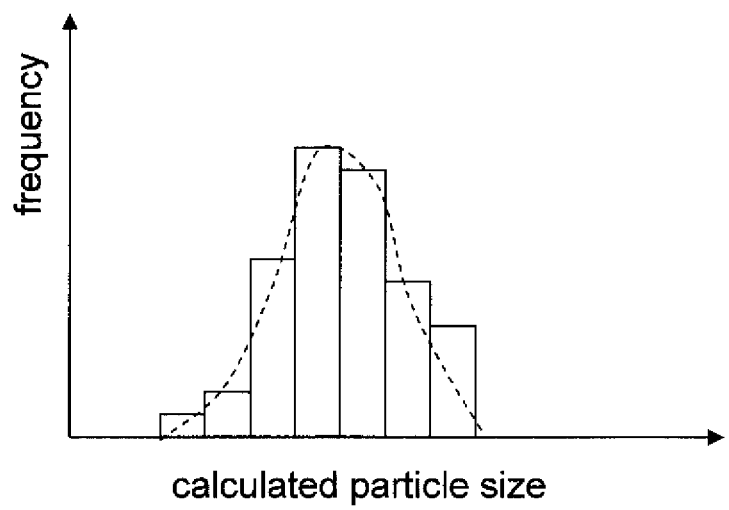
FIG. 15B illustrates one example of the particle size distribution of electrically conductive microparticles in the semiconductor layer.

When the cross section 151$a$ of the semiconductor layer 151 is observed with SEM or TEM, the microparticles 152 and the organic semiconductor material 153 can be distinguished from each other by a difference in color tones (or a difference in shades of gray), as shown in FIG. 15A. For example, in the example shown in FIG. 15A, the microparticles 152 are recognizable as the black bodies. On the other hand, the organic semiconductor material 153 is recognizable as the white color body. The colors and color tones for the corresponding portions vary depending the observation method, but the microparticles 152 and the organic semiconductor material 153 have different colors and/or color tones. Thus, the microparticles 152 and the organic semiconductor material 153 can be distinguished from each other by image processing and binary coding the photograph taken. From the image-processed data, the respective areas of the microparticles 152 are calculated. Using the calculated areas, the particle sizes of the individual microparticles 152 are calculated, with the assumption that the cross sectional shape of each microparticle 152 is a perfect circle. In the foregoing examples, the average particle sizes were calculated by observing TEM photographs of the cross sections of the semiconductor layers. One example of the particle size distribution is shown in FIG. 15B. In this specification, the "average particle size" is obtained by calculating the particle sizes of 100 or more microparticles according to the just-described method and averaging the calculated particle sizes.

[Synthesizing Method of Organic Molecule Shown in FIG. 4B]

Figure 16:
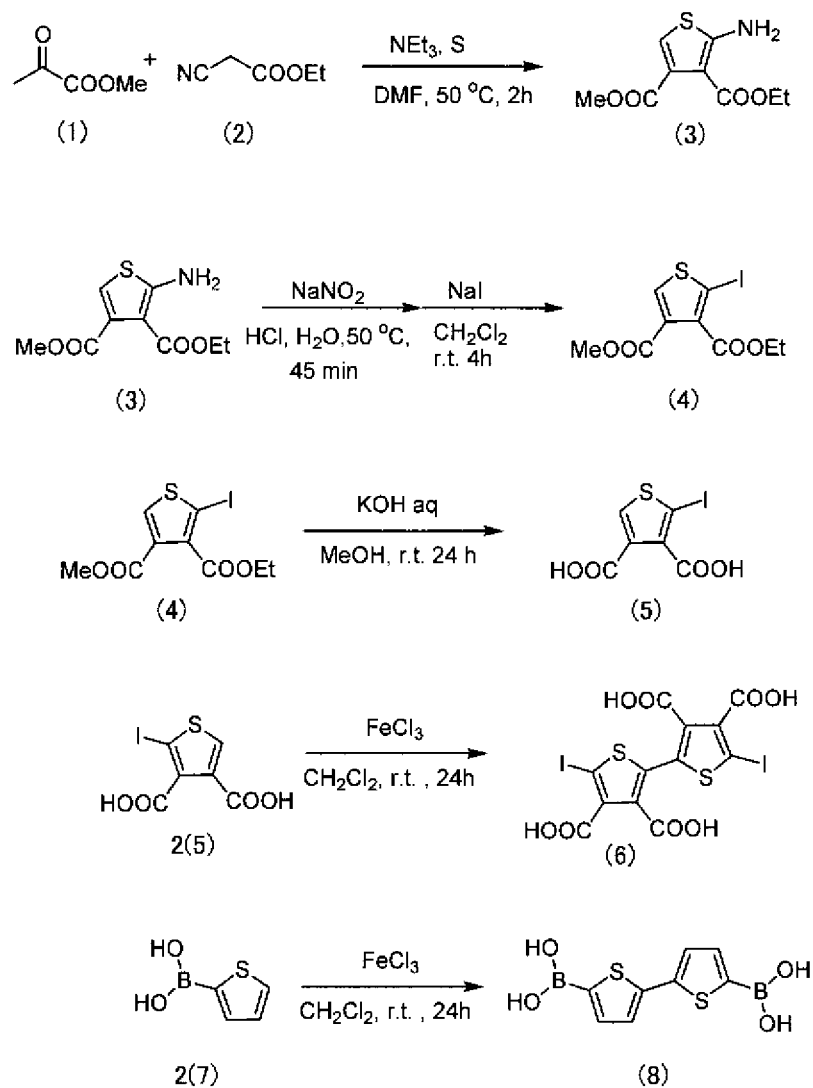
[FIG. 16]
Figure 17:
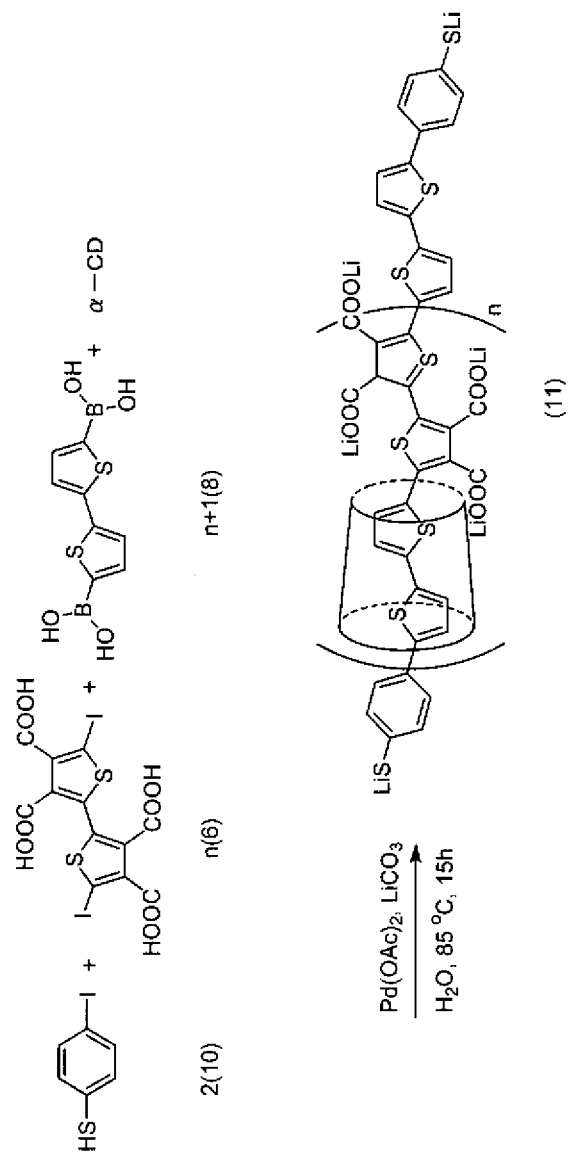
[FIG. 17]

The following describes one example of the method for synthesizing the compound shown in FIG. 4B. First, a compound (6) is synthesized using compounds (1) and (2) shown in FIG. 16 as starting materials under the reaction conditions as set forth in FIG. 16. Also, using a compound (7) shown in FIG. 16 as a starting material, a compound (8) is synthesized. Next, a compound (11) is synthesized using a compound (10) shown in FIG. 17, the compounds (6) and (8) shown in FIG. 16, and a plurality of α-cyclodextrins. After purifying the compound (11) with a large amount of water, the compound

(11) is treated with an acid, whereby the lithium atom is substituted by a hydrogen atom. The compound shown in FIG. 4B can be synthesized in this manner.

[Synthesizing Method of Organic Molecule Shown in FIG. 7A]

Figure 18:
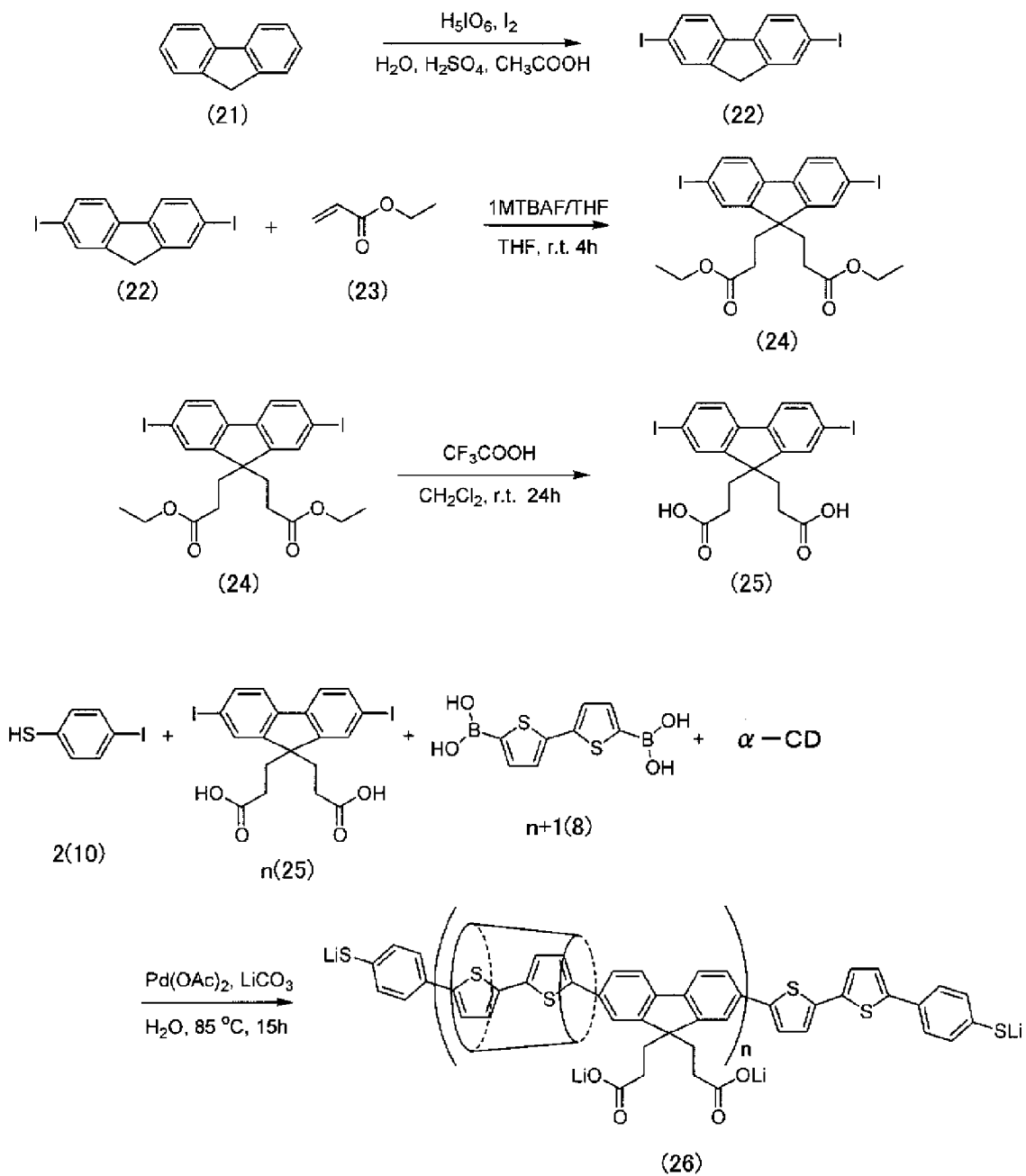
[FIG. 18]

The following describes one example of the method for synthesizing the compound shown in FIG. 7A. First, using a compound (21) shown in FIG. 18 as a starting material, a compound (25) is synthesized under the reaction conditions as set forth in FIG. 18. Next, a compound (26) is synthesized using the compound (25), the compound (10), and the compound (8) shown in FIG. 16, and a plurality of α-cyclodextrins, under the reaction conditions as set forth in FIG. 18. After purifying the compound (26) with a large amount of water, the compound (26) is treated with an acid, whereby the lithium atom is substituted by a hydrogen atom. Thus, the compound shown in FIG. 7A can be synthesized.

[Synthesizing Method of Organic Molecule Shown in FIG. 7B]

Figure 19:
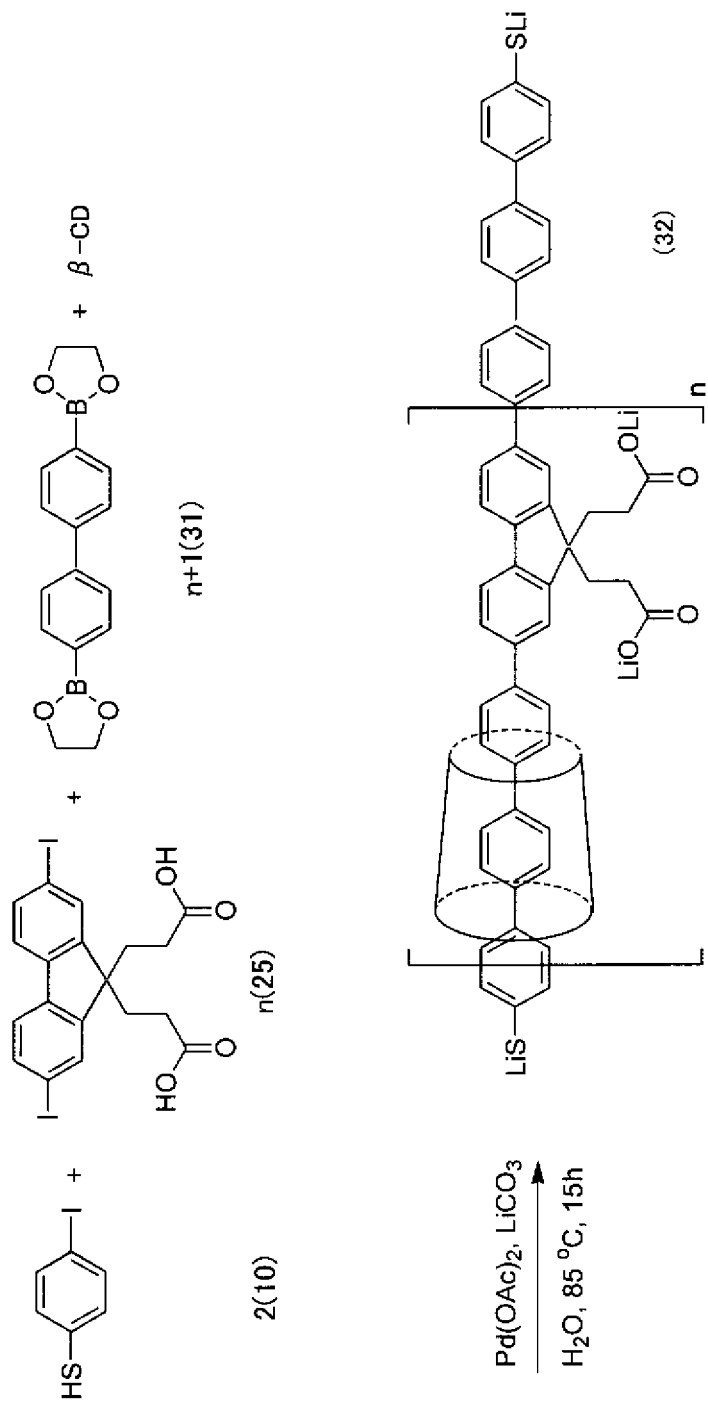
[FIG. 19]

The following describes one example of the method for synthesizing the compound shown in FIG. 7B. As illustrated in FIG. 19, using the compound (10), the compound (25) shown in FIG. 18, a compound (31), and a plurality of α-cyclodextrins as starting materials, a compound (32) is synthesized under the reaction conditions as set forth in FIG. 19. After purifying the compound (32) with a large amount of water, the compound (32) is treated with an acid, whereby the lithium atom is substituted by a hydrogen atom. Thus, the compound shown in FIG. 7B can be synthesized.

Figure 20A:
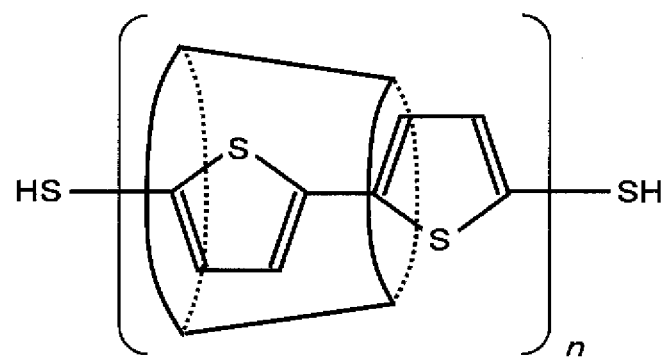
[FIG. 20] FIGS. 20A, 20B, and 20C each illustrate one example of the organic semiconductor molecule used in the present invention.
Figure 20B:
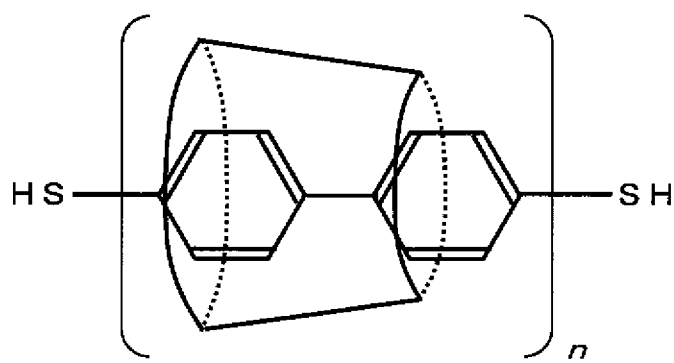
Figure 20C:
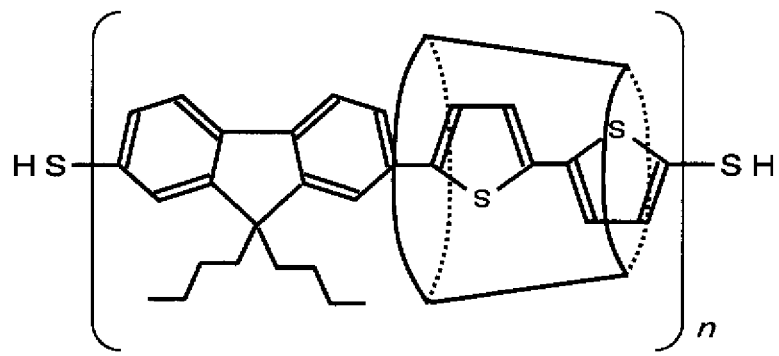

It should be noted that the compounds as shown in FIGS. 20A, 20B, and 20C may be used as the organic semiconductor molecules bonded to the electrically conductive microparticles.

INDUSTRIAL APPLICABILITY

The present invention is applicable to a field-effect transistor having a semiconductor layer containing organic semiconductor molecules, and to a manufacturing method of the transistor. The present invention is also applicable to various electronic devices equipped with such a field-effect transistor.

The invention claimed is:

1. A field-effect transistor comprising:
    a semiconductor layer having a portion functioning as a channel region;
    the semiconductor layer comprising a plurality of electrically conductive microparticles dispersed in the semiconductor layer, organic semiconductor molecules chemically bonded to the microparticles so as to link the microparticles to one another, and cyclic molecules,
    each of the organic semiconductor molecules comprising a π-electron conjugated chain as its main chain,
    the π-electron conjugated chain being insulated by the cyclic molecules,
    the average main chain length of the organic semiconductor molecules being within the range of from 10 nm to 30 nm and being within the range of from 1 to 3 times the average particle size of the microparticles, and
    the average particle size of the microparticles being within the range of from 10 nm to 30 nm.

2. The field-effect transistor according to claim 1, wherein the organic semiconductor molecules comprise a plurality of types of molecules having different main chain lengths.

3. The field-effect transistor according to claim 1, wherein the cyclic molecules are cyclodextrin.

4. The field-effect transistor according to claim 1, wherein an atomic group having a width that is greater than the inner diameter of the cyclic molecule is bonded to an end of the π-electron conjugated chain.

5. The field-effect transistor according to claim 1, further comprising:
    an electrode in contact with the semiconductor layer, and wherein
    the surface of the electrode and the surface of the microparticles comprise a main component made of the same metallic element; and
    a portion of the organic semiconductor molecules are chemically bonded both to the surface of the electrode and to the microparticles.

6. An electronic device comprising:
    at least one field-effect transistor, the field-effect transistor comprising a semiconductor layer having a portion functioning as a channel region,
    the semiconductor layer comprising a plurality of electrically conductive microparticles dispersed in the semiconductor layer, organic semiconductor molecules chemically bonded to the microparticles so as to link the microparticles to one another, and cyclic molecules,
    each of the organic semiconductor molecules comprising a π-electron conjugated chain as its main chain,
    the π-electron conjugated chain being insulated by the cyclic molecules,
    the average main chain length of the organic semiconductor molecules being within the range of from 10 nm to 30 nm and being within the range of from 1 to 3 times the average particle size of the microparticles, and
    the average particle size of the microparticles being within the range of from 10 nm to 30 nm.

7. A method of manufacturing a field-effect transistor comprising a semiconductor layer containing a plurality of electrically conductive microparticles, the method comprising:
    (I) contacting the plurality of the microparticles with organic semiconductor molecules in a solvent, the organic semiconductor molecules each comprising a π-electron conjugated chain insulated by cyclic molecules and two end groups that are disposed at opposing ends of the π-electron conjugated chain and are chemically bonded to the microparticles, to chemically bond the microparticles and the end groups of the organic semiconductor molecules; and
    (II) removing the solvent;
    wherein the average main chain length of the organic semiconductor molecules being within the range of from 10 nm to 30 nm and being within the range of from 1 to 3 times the average particle size of the microparticles, and
    the average particle size of the microparticles being within the range of from 10 nm to 30 nm.

8. The method according to claim 7, wherein the step (I) comprises supplying a first liquid containing the plurality of the microparticles and a first solvent, and second liquid containing the organic semiconductor molecules and a second solvent, to a region in which the semiconductor layer is to be formed, thereby to chemically bond the microparticles and the end groups of the organic semiconductor molecules to one another in the region,
    and the first solvent and the second solvent are removed in the step (II).

* * * * *